United States Patent [19]
Postol

[11] Patent Number: 6,084,534
[45] Date of Patent: Jul. 4, 2000

[54] METHOD FOR EFFICIENT STORAGE AND TRANSMISSION OF THE CENTROIDS OF A LEECH LATTICE QUANTIZER

[75] Inventor: Michael Samuel Postol, Potomac, Md.

[73] Assignee: The United States of America as represented by the Director of the National Security Agency, Washington, D.C.

[21] Appl. No.: 09/332,130

[22] Filed: Jun. 14, 1999

[51] Int. Cl.$^7$ .................................................. H03M 7/00
[52] U.S. Cl. ................. 341/50; 341/87; 341/107
[58] Field of Search .................. 341/50, 87, 107

[56] References Cited

U.S. PATENT DOCUMENTS

| | | | |
|---|---|---|---|
| 4,933,956 | 6/1990 | Forney, Jr. | 375/341 |
| 5,150,209 | 9/1992 | Baker et al. | |
| 5,297,170 | 3/1994 | Eyuboglu et al. | 375/242 |
| 5,805,613 | 9/1998 | Beery et al. | 714/752 |
| 5,883,981 | 3/1999 | Li et al. | 382/253 |

OTHER PUBLICATIONS

Vardy, Alexander & Be'ery Yair, Maximum Likelihood Decoding of the Leech Lattice, IEEE Transactions on Information Theory, vol. 39, No. 4, Jul. 1993.

Vardy, Alexander & Be'ery, Yair, More Efficient Soft Decoding of the Golay Codes, IEEE Transactions on Information Theory, vol. 37, No. 3, May 1991.

*Primary Examiner*—Brian Young
*Assistant Examiner*—Jason L W Kost
*Attorney, Agent, or Firm*—Stephen M. Bloor

[57] ABSTRACT

A method of lattice quantizing a 24-long data point to minimize storage requirements by acquiring the data point, multiplying each coordinate of the data point by the square root of 8 to form an inflated data point, finding the closest point of the inflated Leech lattice by any method, creating a signal packet, and transmitting the packet to a receiver. The receiver receives the signal packet, recovers the inflated lattice point with the aid of a table of 89 of the 4096 codewords of the extended Golay code, replaces each one in the inflated lattice point by the reciprocal of the square root of 8 of the same polarity, replaces each 2 in the inflated lattice point by 2 divided by the square root of 8 of the same polarity, replaces each 3 in the inflated lattice point by 3 divided by the square root of 8 of the same polarity, replaces each 4 in the inflated lattice point by 4 divided by the square root of 8 of the same polarity, and replaces each 5 in the inflated lattice point by 5 divided by the square root of 8 of the same polarity in order to recover the data point.

9 Claims, 29 Drawing Sheets

Lattice-Quantizing a 24-long Data Point for Transmission

Lattice-Quantizing a 24-long Data Point for Transmission

Transmission of Shell 2, Type 1 Lattice Point

Transmission of Shell 2, Type 2 Lattice Point

Transmission of Shell 2, Type 3 Lattice Point

Transmission of Shell 3, Type 1 Lattice Point

Transmission of Shell 3, Type 2 Lattice Point

**Transmission of Shell 3, Type 2 Lattice Point
Using an Alternate Method of S3T2SP 3s Position Indication 179**

Transmission of Shell 3, Type 3 Lattice Point

Transmission of Shell 3, Type 4 Lattice Point

Determining Shell & Type of Inflated Lattice Point and Reception of Shell 2, Type 1 Lattice Point

Reception of Shell 2, Type 2 Lattice Point

Reception of Shell 2, Type 3 Lattice Point

Reception of Shell 3, Type 1 Lattice Point

Reception of Shell 3, Type 2 Lattice Point

Reception of Shell 3, Type 2 Lattice Point (cont.)

Step 254:
(EXACTLY ONE GROUP CONTAINS POSITIVE OR NEGATIVE 3s)
For each position in this group, replace the -1 by a 3 if the position is in the C-set, otherwise replace the 1 in the position with a -3

Step 255:
Go to Step 264
(Fig. 13f)

Reception of Shell 3, Type 2 Lattice Point (cont.)
Fig. 13c

Reception of Shell 3, Type 2 Lattice Point (cont.)

Step 260:
(ONE GROUP CONTAINS ONE AND ONE GROUP CONTAINS TWO POSITIVE OR NEGATIVE 3s)
Use the S3T2ASP group indicator 339d to determine if the 1st or 2nd of the groups has the two 3s and, therefore, which has one 3

Step 261:
Determine if the positive or negative 3 is in the 1st position in the group with one positive or negative 3 using the S3T2ASP one 3 group first position indicator 339e, if not determine if it is in the second or third position using the S3T2ASP one 3 group second/third position indicator 339f

Step 262:
Determine if the positive or negative 3 is in the first position in the group with two positive or negative 3s using the S3T2ASP two 3 group first position indicator 339g, if so determine if the other 3 is in the 2nd or 3rd position using the S3T2ASP two 3 group second/third position indicator 339h, if not the two positive or negative 3s must be in the second & third position

Step 263:
For each position with a 3, if it is in the C-set replace the -1 in this position with a 3, otherwise replace the 1 in this position with a -3

Go to Step 264 (Fig. 13f)

Reception of Shell 3, Type 2 Lattice Point (cont.)
Fig. 13e

Step 264: Replace each 1 with $1/\sqrt{8}$ and each -1 with $-1/\sqrt{8}$

Step 265: Replace each 3 with $3/\sqrt{8}$ and each -3 with $-3/\sqrt{8}$

Reception of Shell 3, Type 2 Lattice Point (cont.)
Fig. 13f

Reception of Shell 3, Type 3 Lattice Point

Reception of Shell 3, Type 4 Lattice Point

60. (0,0,0,0,1,1,1,1,1,0,1,0,1,1,0,0,1,1,0,0,1,0,1,0);
61. (0,0,0,1,0,0,0,1,0,1,1,1,1,0,1,1,1,0,0,1,1,0,1,0);
62. (0,0,0,1,0,0,0,1,1,1,1,1,1,1,1,0,0,0,1,0,0,1,1,0);
63. (0,0,0,1,0,0,1,0,1,0,0,1,1,1,1,1,0,0,1,1,1,0,1,0);
64. (0,0,0,1,0,0,1,0,1,1,1,0,0,0,1,1,1,0,1,0,1,1,1,0);
65. (0,0,0,1,0,0,1,1,0,1,1,0,1,1,0,1,0,1,1,0,1,0,1,0);
66. (0,0,0,1,0,0,1,1,1,1,1,0,1,0,0,0,1,1,0,1,0,1,1,0);
67. (0,0,0,1,0,1,0,0,1,1,0,1,1,0,0,0,1,0,1,1,1,1,1,0);
68. (0,0,0,1,0,1,0,1,0,0,1,0,1,0,1,0,1,1,1,0,1,1,1,0);
69. (0,0,0,1,0,1,0,1,0,1,0,1,0,1,1,0,0,1,1,1,1,0,1,0);
70. (0,0,0,1,0,1,0,1,1,0,1,0,1,1,1,1,0,1,0,1,0,0,1,0);
71. (0,0,0,1,0,1,0,1,1,1,0,1,0,0,1,1,1,1,0,0,0,1,1,0);
72. (0,0,0,1,0,1,1,0,0,0,1,1,0,1,1,1,0,1,1,0,0,1,1,0);
73. (0,0,0,1,0,1,1,0,0,1,0,0,1,0,1,1,1,1,1,1,0,0,1,0);
74. (0,0,0,1,0,1,1,0,1,0,1,1,0,0,1,0,1,1,0,1,1,0,1,0);
75. (0,0,0,1,0,1,1,0,1,1,0,0,1,1,1,0,0,1,0,0,1,1,1,0);
76. (0,0,0,1,1,0,0,1,0,1,0,1,1,1,0,0,1,1,0,0,1,1,1,0);
77. (0,0,0,1,1,0,0,1,1,0,1,0,0,1,0,1,1,1,1,0,0,1,1,0);
78. (0,0,0,1,1,0,0,1,1,1,0,1,1,0,0,1,0,1,1,1,0,0,1,0);
79. (0,0,0,1,1,0,1,0,0,0,1,1,1,1,0,1,1,1,0,1,0,0,1,0);
80. (0,0,0,1,1,0,1,1,0,0,1,1,0,1,1,0,1,0,1,0,1,0,1,0);
81. (0,0,0,1,1,0,1,1,0,1,0,0,1,0,1,0,0,0,1,1,1,1,1,0);
82. (0,0,0,1,1,1,0,0,0,1,1,1,1,0,1,0,0,1,0,1,0,1,1,0);
83. (0,0,0,1,1,1,0,1,1,1,1,0,1,0,0,1,0,0,1,0,0,1,1,0);
84. (0,0,0,1,1,1,1,0,0,1,1,0,1,1,0,0,1,0,1,0,0,1,1,0);
85. (0,0,1,0,0,1,0,0,1,1,1,0,0,1,0,0,1,1,0,1,1,1,1,0);
86. (0,0,1,0,0,1,0,1,0,1,1,1,1,0,0,1,0,1,0,1,0,1,1,0);
87. (0,0,1,0,0,1,1,1,0,1,1,0,1,0,1,0,0,1,0,1,1,0,1,0);
88. (0,0,1,0,1,0,1,0,0,1,1,0,1,0,1,1,1,0,0,1,0,1,1,0); and
89. (0,0,1,0,1,1,0,0,1,1,0,1,0,1,0,1,0,0,1,1,1,0,1,0);

Fig. 16c

Shell 2, Type 1 Signal Packet (S2T1SP) 321

Shell 2, Type 2 Signal Packet (S2T2SP) 322

Shell 2, Type 3 Signal Packet (S2T3SP) 323

Shell 3, Type 1 Signal Packet (S3T1SP) 331

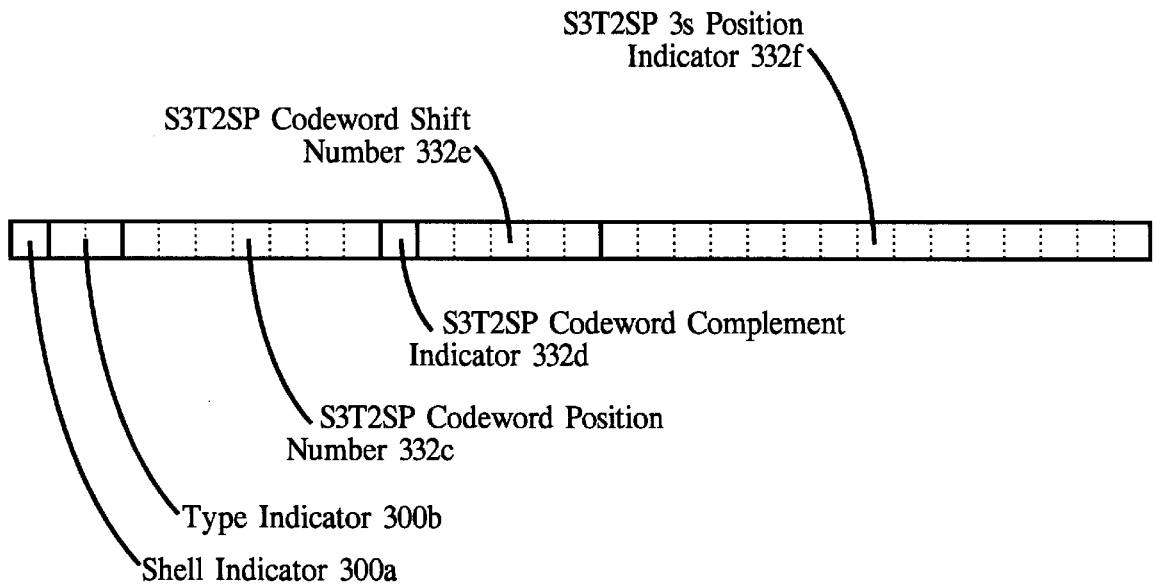
Shell 3, Type 2 Signal Packet (S2T3SP) 332
(Using the Simple Method of S3T2SP 3s Position Indication 178)
FIG. 21
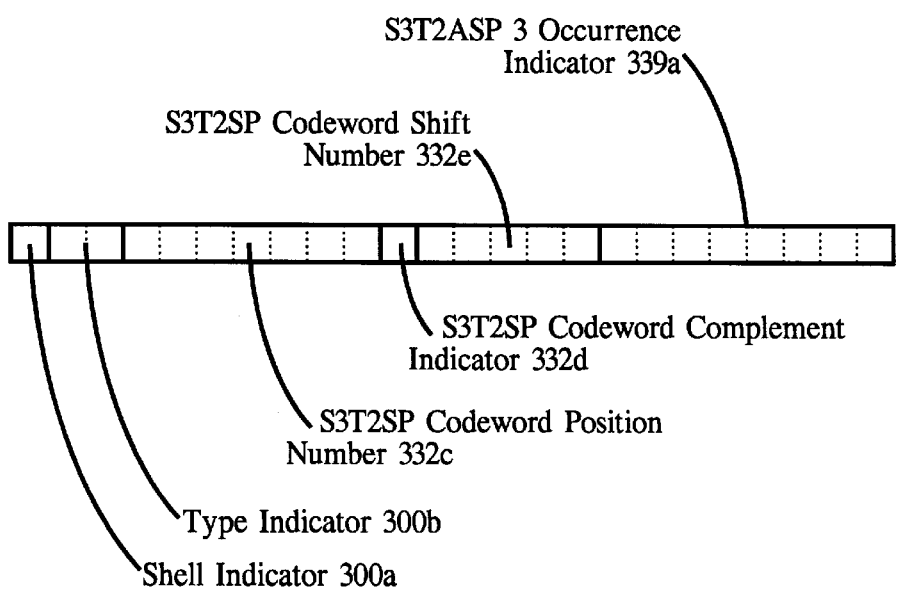
Shell 3, Type 2 Alternate Signal Packet (S2T3ASP) 339
(Using the Alternate Method of S3T2SP 3s Position Indication 179)
FIG. 22a - Exactly 1 Group Contains Positive or Negative 3s

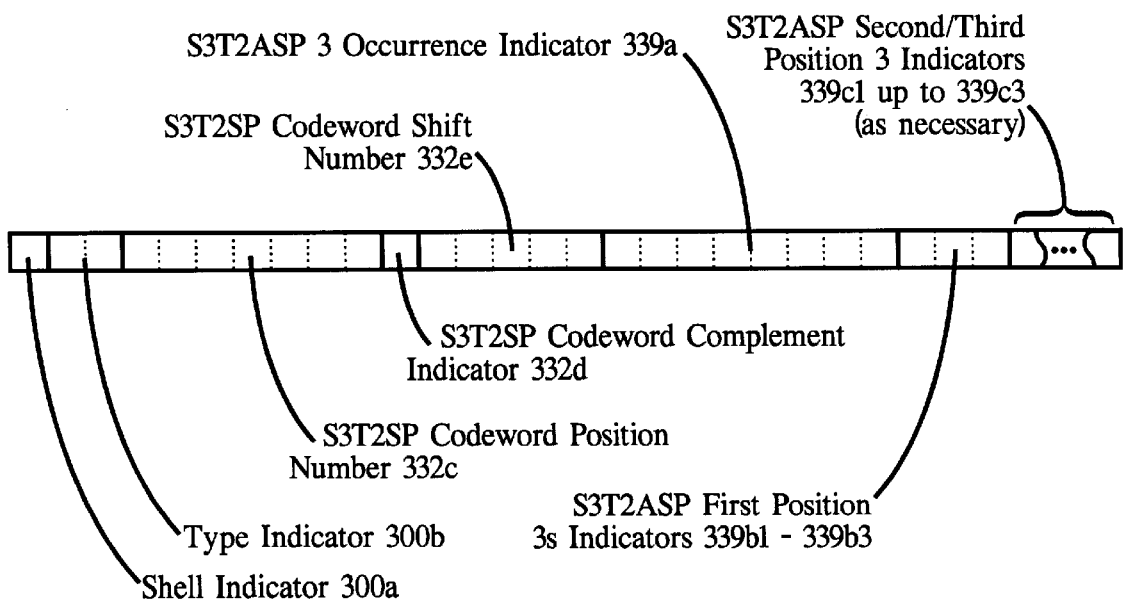
Shell 3, Type 2 Alternate Signal Packet (S2T3ASP) 339
(Using the Alternate Method of S3T2SP 3s Position Indication 179)
FIG. 22b - Three Groups Contain Positive or Negative 3s
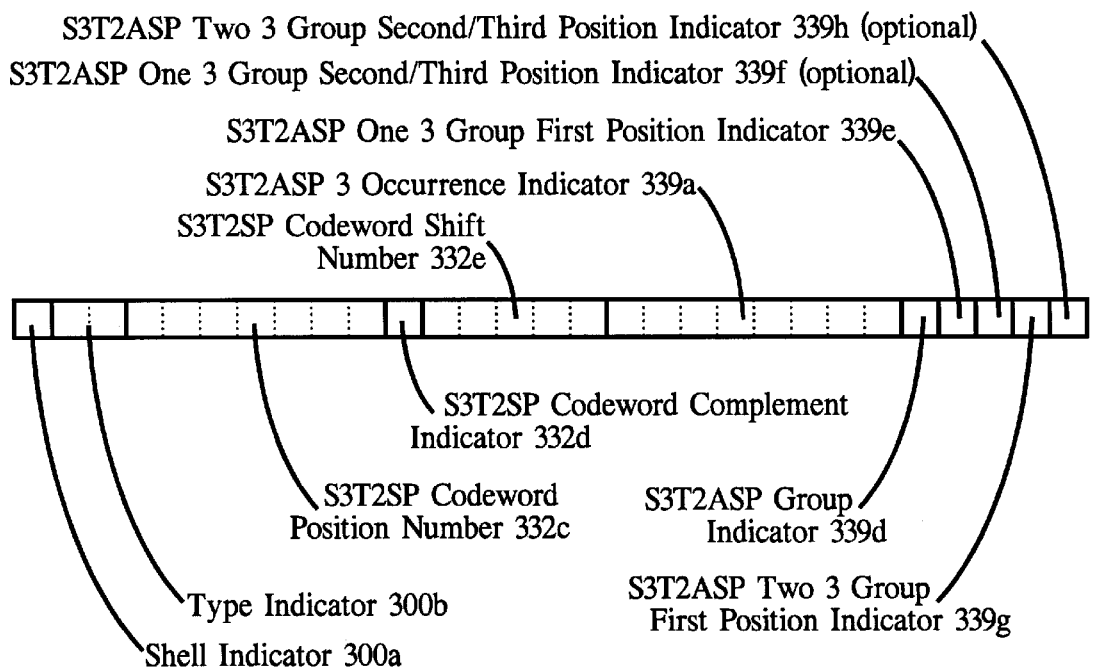
Shell 3, Type 2 Alternate Signal Packet (S2T3ASP) 339
(Using the Alternate Method of S3T2SP 3s Position Indication 179)
FIG. 22c - One Group Has One and
One Group Has 2 Positive or Negative 3s

Shell 3, Type 3 Signal Packet (S3T4SP) 333

Shell 3, Type 4 Signal Packet (S3T4SP) 334

METHOD FOR EFFICIENT STORAGE AND TRANSMISSION OF THE CENTROIDS OF A LEECH LATTICE QUANTIZER

FIELD OF THE INVENTION

The present invention, a method of efficient storage and transmission of the centroids of a leech lattice quantizer, relates to pulse or digital communications and, more particularly, to a quantizer or inverse quantizer.

BACKGROUND OF THE INVENTION

A quantizer is a device for converting numerical data into a finite number of possible outputs. That is, the input to a quantizer may be any value, but the output of a quantizer is limited to only certain values. The function of a quantizer is to determine which of its possible output values is closest to the input value and put out that value. For example, a flip-flop puts out either a voltage equal to the power supply voltage connected to the flip-flop (e.g., five volts or a logic one) or a voltage equal to the ground voltage connected to the flip-flop (e.g., zero volts or a logic zero). The input to a flip-flop may be any value between ground voltage and the power supply voltage. The flip-flop determines which of its two possible output values is closest to the input value and puts out that value. Typically, an input voltage greater than or equal to one-half of the power supply voltage will cause a flip-flop to put out the power supply voltage (i.e., a logic one) while an input voltage below one-half of the power supply voltage will cause a flip-flop to put out the ground voltage (i.e., a logic zero).

Quantizers are used in the design of signals for use over a noisy channel. Analog to Digital converters convert complex analog signals (e.g., 0.654783 V) into simplistic digital signals (e.g., logic 1). This is a form of data compression. An area centered at one of the allowable outputs is called a Voronoi region. If the quantizer receives a point in this region, it converts it, if necessary, to the allowable point in the center of the region.

Quantizers come in two types, scalar quantizers and vector quantizers. A scalar quantizer quantizes data from a single source by rounding a real number to its nearest output value (e.g., a flip-flop). A vector quantizer quantizes data from multiple sources by choosing one point from a finite set of points in n-dimensional space that is closest to the point represented by the input vector. A point in n-dimensional space is simply a string of n real numbers. That is, $x=(x_1, x_2, x_3, \ldots, x_n)$. For example, a point in three dimensional space is a point represented by three coordinates, a point in four dimensional space is a point represented by four coordinates, and so on. The allowed output values of a vector quantizer are called centroids.

The present invention concerns a lattice quantizer. A lattice in n-dimensional space is defined as follows. Let $(v_1, v_2, \ldots, v_n)$ be a set of n linearly independent vectors in n-dimensional space. The lattice generated by $(v_1, v_2, \ldots, v_n)$ is the set $(c_1v_1+c_2v_2+ \ldots +c_nv_n)$, where $c_1, \ldots, c_n$ are integers. The vectors $v_1, v_2, \ldots, v_n$ form a basis for the lattice. If $X=(x_1, x_2, \ldots, x_n)$ then the norm of x is equal to $(x_1^2+x_2^2+ \ldots +x_n^2)$. A sphere in n-dimensional space with center $u=(u_1, u_2, \ldots, u_n)$ and radius p consists of all the points $x=(x_1, x_2, x_3, \ldots, x_n)$ satisfying $(x_1-u_1)^2+(x_2-u_2)^2+ \ldots +(x_n-u_n)^2=p^2$. A sphere packing is described by specifying the centers u and the radius p. When the centers of a group of spheres form a lattice, the packing is referred to as a lattice packing. A lattice packing always has a center at a point designated as an origin with the remaining centers on concentric spheres around the origin. The shells are numbered according to their proximity to the center or origin point. That is, the shell closest to the origin point is shell 1, the shell second closest to the origin point is shell 2, and so on. If one lattice may be obtained from another by rotation, reflection, or change of scale then it is said that the lattices are equivalent or similar.

Mathematicians continue to look for dense packings of n-dimensional spheres because there are important practical applications of sphere packing to problems arising in digital communications. A finite subset of the points on the surface of a sphere is called a spherical code. Spherical codes may be constructed from sphere packings. The sphere packing density of a lattice is defined by the number of spheres that fit within a particular volume. The kissing number of a lattice is defined as the number of spheres that a sphere in the lattice touches. The 24-dimensional lattice called the Leech lattice has the highest sphere packing density and the highest possible kissing number in 24 dimensions.

In a lattice quantizer, the centroids are grid points in n-dimensional space. The advantage of using a lattice quantizer is that the centroids are already known and do not have to be calculated from the input data. The disadvantage of using a lattice quantizer is that there are an infinite number of centroids. Because of this, lattice quantizers are only appropriate for quantizing data that has a probability distribution that is heavily concentrated around a single point in n-dimensional space (e.g., the origin).

Quantizing introduces error. The magnitude of the error is the distance from the received point to the acceptable point. The acceptable points are chosen to minimize the error, or more precisely, to minimize the mean squared error. For various dimensions, the mean squared error has been determined. It may be shown that higher dimension quantizers have lower errors per symbol than do lower dimension quantizers. Higher dimension quantizers with their lower errors provide better quantization than do lower dimension quantizers.

The Leech lattice has been extensively studied by mathematicians due to its connections to the fields of coding theory, combinatorics, and the classification of finite simple groups. As a result, a number of fast algorithms for finding the closest lattice point have been developed. These algorithms fall into two categories: maximum likelihood decoding and bounded distance decoding. Bounded distance decoding will not work in quantizer applications, since it only works for a received point within a small distance of a lattice point. Maximum likelihood decoding works for any received point and is well suited for a quantizer. A very fast algorithm is the algorithm described by Alexander Vardy and Yair Be'ery in "*Maximum Likelihood Decoding of the Leech Lattice,*" IEEE TRANSACTIONS ON INFORMATION THEORY, Vol. 39, No. 4, July 1993, pp. 1435–1444. It takes only 3595 real operations in the worst case and 2955 operations on the average.

There has been a reluctance to use the Leech lattice in applications because of the large number of lattice points involved. Let shell i be set of points with norm $2i$. Then there are no points in shell 1, but 196,560 points in shell 2 and 16,773,120 points in shell 3, etc. The present invention can transmit any Leech lattice point while only storing eighty-nine 24-bit codewords of the extended Golay code. An explicit method is given for transmission of points in shells 2 and 3, which can easily be extended to higher shells. This algorithm can be applied to the output of the algorithm of Vardy and Be'ery or any other algorithm for finding the closest point of the Leech lattice.

There are a number of advantages to using the Leech lattice as a quantizer. First, a number of fast algorithms have already been developed for finding the closest lattice point. Also, the Leech lattice has a smaller quantizer error than any known lattice of equal or lower dimension. U.S. Pat. No. 5,150,209, listing Richard L. Baker, Jeffrey Bernstein, Bernd Girod, Xiancheng Yuan, and Edmund Thompson as inventors, entitled "HEIRARCHICAL ENTROPY CODED LATTICE THRESHOLD QUANTIZATION ENCODING METHOD AND APPARATUS FOR IMAGE AND VIDEO COMPRESSION" discloses an eight dimensional lattice quantizer based on the E8 lattice. Each lattice point in E8 is sent using 9 bits for shell 1 or 12 bits for shell 2 lattice points. The present invention sends Leech lattice points with a maximum of 21 bits for shell 2 and 31 bits for shell 3 lattice points. (There are no shell 1 Leech lattice points.) The present invention uses fewer than 3 times the number of bits used to send the E8 lattice points, but the Leech lattice points contain 3 times as much information as the E8 lattice points. Although a smaller region of space is covered, the points are scaled before being input to the E8 lattice, and a similar procedure can be carried out for the Leech lattice. Finally, the E8 quantizer in the '209 patent, referenced above, stores 920 eight-long vectors of real numbers to keep track of 2400 lattice points. The present invention stores 89 twenty-four bit codewords to send the nearly 17 million points of shells 2 and 3, and by extension, any Leech lattice point.

SUMMARY OF THE INVENTION

In consideration of the problems detailed above and the discrepancies enumerated in the partial solutions thereto, an object of the present invention is to minimize the storage requirement of a 24-dimensional lattice quantizer.

Another object of the present invention is to only require the storage of eighty-nine 24-bit words and in a 24-dimensional lattice quantizer. As an option $2/\sqrt{8}$, $3/\sqrt{8}$, $4/\sqrt{8}$, and $5/\sqrt{8}$ can be stored.

Another object of the present invention is to minimize the computational complexity of the receiver in a 24-dimensional lattice quantizer by requiring only replacement of 1s by $1/\sqrt{8}$, replacement of 2s by $2/\sqrt{8}$, replacement of 3s by $3/\sqrt{8}$, replacement of 4s by $4/\sqrt{8}$, and replacement of 5s by $5/\sqrt{8}$.

In order to attain the objectives described above, according to an aspect of the present invention, there is provided a method of efficient storage and transmission of the centroids of a Leech lattice quantizer. The present invention relates to a method for efficient storage and transmission of the centroids of a Leech lattice quantizer. The concept is to quantize a data point so that it may be transmitted error-free in a noisy channel and reduce bandwidth. The specific steps for the method of the present invention are as follows:

The first step is to acquire a 24 dimensional data point.

The second step is to multiply each coordinate of the data point by $\sqrt{8}$ to form an inflated data point.

The third step is to use any algorithm to find the closest inflated Leech Lattice point to the inflated data point.

The fourth step is to create a signal packet and transmit that packet.

The present invention stores 89 of the 24 bit long extended Golay code codewords. The entire code can be reconstructed as follows: The 89 codewords consist of 33 codewords of weight 8 (octads) and 56 codewords of weight 12 (dodecads). By fixing the last bit of each of these codewords and performing all of the possible 23 right circular shifts on the first 23 bits, we get 33×23=759 octads and 56×23=1288 dodecads. Complementing each of these words produces another 759 codewords of weight 16 and another 1288 dodecads. We also have the all 0s and all 1s codewords. This gives a total of 759+1288+759+1288+1+1=4096 codewords. This is the entire extended Golay code. As explained above, only 89 of these codewords need be stored; the entire 4096 can be constructed from them. Both the transmitter and the receiver store these 89 codewords. The transmitter multiplies the acquired data point by $\sqrt{8}$, so it must store this value. The receiver also stores the values of $1/\sqrt{8}$, $2/\sqrt{8}$, $3/\sqrt{8}$, $4/\sqrt{8}$, and $5/\sqrt{8}$.

In order for the receiver to deflate an inflated data point, the receiver either multiplies each coordinate of the inflated data point by $1/\sqrt{8}$ or replaces each 1 by $1/\sqrt{8}$, each 2 by $2/\sqrt{8}$, each 3 by $3/\sqrt{8}$, each 4 by $4/\sqrt{8}$, and each 5 by $5/\sqrt{8}$. The polarity of the 1s, 2s, 3s, 4s, and 5s are also taken into account by setting a polarity bit accordingly. By using the replacement approach, the equivalent of multiplication is achieved more efficiently.

There are 3 types of shell 2 points and 4 types of shell 3 points. A C-set is defined as a set of coordinates that correspond to the position of the 1s in some codeword of the extended Golay code.

A type 1 point in shell 2 contains eight positive or negative 2s and sixteen 0s, where the positions of the 2s form a C-set and there are an even number of −2s. To transmit such a point, 21 bits are transmitted: one bit indicates shell 2, two bits indicate type 1, six bits indicate a codeword in the extended Golay code (since only octads are considered), five bits indicate the rotation to form the codeword corresponding to the C-set, and seven bits are used to indicate the polarity of the first seven 2s. The polarity of the last 2 is then determined since only an even number of 2s can be negative. In order to recover the intended data point, each 2 in the recovered inflated data point is replaced by $2/\sqrt{8}$ and each −2 is replaced by $-2/\sqrt{8}$.

A type 2 point in shell 2 contains one positive or negative 3 and twenty-three positive or negative 1s where the positions of the 1s form a C-set if the −3 is used and the positions of the −1s together with the position of the 3 form a C-set if +3 is used. To transmit such a point, 21 bits are transmitted: one bit indicates shell 2, two bits indicate type 2, seven bits indicates a codeword in the extended Golay code, one bit indicates if this word or its complement is indicated, five bits indicate the rotation to form the codeword corresponding to the C-set, and five bits indicate the position of the positive or negative 3. In order to recover the intended data point, each 3 in the recovered inflated data point is replaced by $3/\sqrt{8}$, each −3 is replaced by $-3/\sqrt{8}$, each 1 is replaced by $1/\sqrt{8}$, and each −1 is replaced by $-1/\sqrt{8}$.

A type 3 point in shell 2 contains two positive or negative 4s and twenty-two 0's. To transmit such a point, 15 bits are transmitted: one bit indicates shell 2, two bits indicate type 3, five bits indicate the position of the first positive or negative 4, five bits indicate the position of the second positive or negative 4, and two bits indicate the polarity of the 4s. In order to recover the intended data point, each 4 in the recovered inflated data point is replaced by $4/\sqrt{8}$ and each −4 is replaced by $-4/\sqrt{8}$.

A type 1 point in shell 3 contains twelve positive or negative 2s and twelve 0s, where the positions of the 2s form a C-set and there are an even number of −2s. To transmit such a point, 27 bits are transmitted: one bit indicates shell 3, two bits indicate type 1, seven bits indicate a codeword in the extended Golay code, one bit indicates if this word or its complement is indicated, five bits indicate the rotation to form the codeword corresponding to the C-set, and eleven bits are used to indicate the polarity of the first eleven 2s. The polarity of the last 2 is then determined since only an even number of 2s can be negative. In order to recover the intended data point, each 2 in the recovered inflated data point is replaced by $2/\sqrt{8}$ and each −2 is replaced by $-2/\sqrt{8}$.

A type 2 point in shell 3 contains three positive or negative 3s and twenty-one positive or negative 1s, where the positions of the −1s and +3s (if any) form a C-set. To transmit such a point, 31 bits are transmitted: one bit indicates shell 3, two bits indicate type 2, seven bits indicates a codeword in the extended Golay code, one bit indicates if this word or its complement is indicated, five bits indicate the rotation to form the codeword corresponding to the C-set, five bits indicate the position of the first positive or negative 3, five bits indicate the position of the second positive or negative 3, and five bits indicate the position of the third positive or negative 3. In order to recover the intended data point, each 3 in the recovered inflated data point is replaced by $3/\sqrt{8}$, each −3 is replaced by $-3/\sqrt{8}$, each 1 is replaced by $1/\sqrt{8}$, and each −1 is replaced by $-1/\sqrt{8}$.

As an alternative method for representing the positions of the three positive or negative 3s in the previous case, the twenty-four positions are broken into eight sets of 3 positions each. One bit for each group of three positions is used to indicate if it contains a 3. This uses 8 bits. If only one of these groups contains 3s this alternate method is completed, using only 8 bits. If three of them contain 3s, each one has one 3. One bit in each is used to determine if the first position has a 3 and if not, a second bit is used to determine if the 3 is in the second or third position. This uses between 11 and 14 bits. If two of the groups contain 3s, one bit is used to determine which group has two 3s. For the group with one 3, one or two bits are used, as described above. For the group with two 3s one bit is used to indicate if there is a 3 in the first position. If not, this alternative method is complete, otherwise one bit is used to find the other position. In this case, the position of the three positive or negative 3s can be represented using only from 11 to 13 bits, inclusive. This alternative method always uses 8 to 14 bits to represent the positions of the three positive or negative 3s, which is always fewer than the 15 bits needed in the previously described method.

A type 3 point in shell 3 contains one positive or negative 4, eight positive or negative 2s and fifteen 0s, where the positions of the 2s form a C-set and there are an odd number of −2s. To transmit such a point, 26 bits are transmitted: one bit indicates shell 3, two bits indicate type 3, six bits indicate a codeword in the extended Golay code (since only octads are considered), five bits to indicate the rotation to form the codeword corresponding to the C-set, seven bits are used to indicate the polarity of the first seven 2s (the polarity of the last 2 is then determined since only an odd number of 2s can be negative), four bits are used for the position of the positive or negative 4, and one bit is used to indicate the polarity of the 4. In order to recover the intended data point, each 2 in the recovered inflated data point is replaced by $2/\sqrt{8}$, each −2 is replaced by $-2/\sqrt{8}$, each 4 is replaced by $4/\sqrt{8}$, and each −4 is replaced by $-4/\sqrt{8}$.

A type 4 point in shell 3 contains one positive or negative 5 and twenty-three positive or negative 1s where the positions of the −1s form a C-set if the +5 is used and the positions of the −1s, together with the position of the −5, form a C-set if −5 is used. To transmit such a point, 21 bits are transmitted: one bit indicates shell 2, two bits indicate type 2, seven bits indicates a codeword in the extended Golay code, one bit indicates if this word or its complement is indicated, five bits indicate the rotation to form the codeword corresponding to the C-set, and five bits indicate the position of the positive or negative 5. In order to recover the intended data point, each 5 in the recovered inflated data point is replaced by $5/\sqrt{8}$, each −5 is replaced by $-5/\sqrt{8}$, each 1 is replaced by $1/\sqrt{8}$, and each −1 is replaced by $-1/\sqrt{8}$.

A signal packet that represents a codeword, which is based on a rounded and inflated data point that is closest to the inflated data point, and information necessary to modify the codeword in order to reconstruct the rounded and inflated data point, is then transmitted to a receiver. The receiver decodes the signal packet in order to reconstruct the intended codeword, reconstruct the rounded and inflated data point from the intended codeword, and recovers the intended data point from the rounded and inflated data point. Note that only one table and five values need be stored by the receiver in order to do this. That is, the table of 89 codewords of the 24-bit extended Golay Code, $1/\sqrt{8}$, $2/\sqrt{8}$, $3/\sqrt{8}$, $4/\sqrt{8}$, and $5/\sqrt{8}$.

The aforementioned features, objects, and advantages of this method over the prior art will become apparent to those skilled in the art from the following detailed description and accompanying drawings.

BRIEF DESCRIPTION OF THE DRAWINGS

My invention can best be understood when reading the following specification with reference to the accompanying drawings, which are incorporated in and form a part of the specification, illustrate alternate methods of the present invention, and together with the description, serve to explain the principles of the invention. In the drawings:

FIGS. 13a–f are a list of steps for decoding a signal packet for a type 2 lattice point in shell 3 according to two methods of the present invention.

FIGS. 16a–c list the 89 extended Golay codewords needed to recover all 4096 words of the Golay code according to a method of the present invention.

FIG. 21 is an example representation of a signal packet for a type 2 lattice point in shell 3 according to a method of the present invention.

FIG. 22a–c are example representations of signal packets for a type 2 lattice point in shell 3 according to alternate methods of the present invention.

DETAILED DESCRIPTION OF THE PREFERRED EMBODIMENTS

Figure 1:
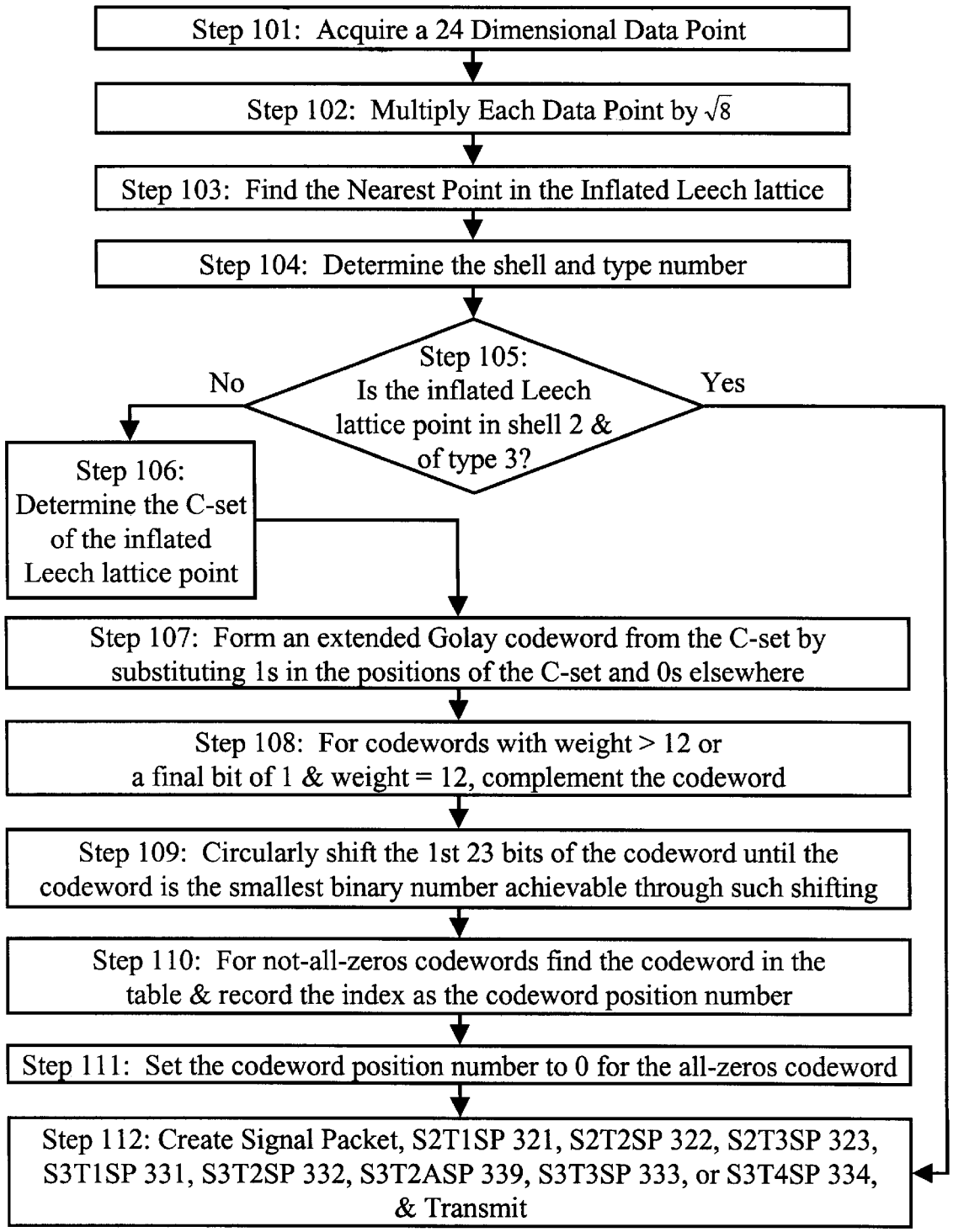
FIG. 1 is a list of the steps for quantizing a data point prior to transmission according to a method of the present invention.

The present invention is a method of lattice quantizing 24 real-number-long data points so that storage requirements are minimized. U.S. Pat. No. 5,150,209, referenced above, describes a method of lattice quantizing an 8 real-number-long data point for a videoconferencing application. The device described in this patent is able to transmit the 2400 points in the first 2 shells of the E8 lattice while storing only 920 points. U.S. application Ser. No. 09/096,375, Attorney Docket No. POSTOL-1, "METHOD OF LATTICE QUANTIZATION THAT MINIMIZES STORAGE REQUIREMENTS AND COMPUTATIONAL COMPLEXITY" by Michael Postol, filed Jun. 12, 1998, discloses a method that reduces this number by storing only the 16 eight bit codewords of the extended Hamming code. The present invention uses the 24 dimensional Leech lattice for lattice quantization. The first 2 nonempty shells contain almost 17 million points. The present invention can transmit any of these points while storing only 89 of the 4096 twenty-four bit codewords of the extended Golay code. These 89 codewords must be stored at both the receiver and the transmitter. There are a number of advantages to using the Leech lattice. First, it has a smaller quantizer error per symbol than any known lattice of equal or smaller dimension. Secondly, it has been extensively studied and a number of fast algorithms exist for finding the nearest lattice point. Finally, if we allow initial scaling of the data point, we can send 3 times as much information as in the 8 dimensional case with fewer than 3 times the number of bits.

Throughout the following discussions of the preferred embodiments and in the various examples and figures a binary 1 is often used to indicate a logical condition and bit position is described for convenience as having an order, i.e. $1^{st}$, $2^{nd}$, $3^{rd}$, etc. It will be appreciated by those skilled in this art that this coding is arbitrarily chosen for example purposes and that the binary compliment of any bit and other bit orders are equally effective.

The Leech lattice is defined as follows. Define a C-set to be the positions of the ones in a codeword of the extended Golay code. Let $(x_1, x_2, \ldots, x_{24})$ be a data point and $(y_1, y_2, \ldots, y_{24}) = ((\sqrt{8})x1, (\sqrt{8})x2, \ldots, (\sqrt{8})x24)$. Call $(y_1, y_2, \ldots, y_{24})$ the inflated data point. Then $(x_1, x_2, \ldots, x_{24})$ is in the Leech lattice if and only if one of the following two conditions hold: Condition 1: $y_1, y_2, \ldots, y_{24}$ are all even, $y_1+y_2+\ldots+y_{24}$ is a multiple of 8, and the positions of the $y_i$ such that $y_i=0$ modulo 4 is a C-set. (Note that the empty set is also a C-set corresponding to the all 0s codeword.) Condition 2: $y_1, y_2, \ldots, y_{24}$ are all odd, $y_1+y_2+\ldots+y_{24}$ is a multiple of 4 which is not a multiple of 8, and the positions of the $y_i$ such that $y_i=1$ modulo 4 is a C-set.

There are no points in shell 1.

In shell 2, there are 3 types of inflated lattice points: A type 1 point in shell 2 contains eight positive or negative 2s and sixteen 0s, where the positions of the 2s form a C-set and there are an even number of –2s. A type 2 point in shell 2 contains one positive or negative 3 and twenty-three positive or negative 1s where the positions of the –1s form a C-set if the –3 is used and the positions of the –1s together with the position of the 3 form a C-set if +3 is used. A type 3 point in shell 2 contains two positive or negative 4's and twenty-two 0s.

In shell 3 there are four types of inflated lattice points. A type 1 point in shell 3 contains twelve positive or negative 2s and twelve 0s where the positions of the 2s form a C-set and there are an even number of –2s. A type 2 point in shell 3 contains three positive or negative 3s and twenty-one positive or negative 1s where the positions of the –1s and +3s (if any) form a C-set. A type 3 point in shell 3 contains one positive or negative 4, 8 positive or negative 2s and fifteen 0s, where the positions of the 2s form a C-set and there is an odd number of –2s. A type 4 point in shell 3 contains one positive or negative 5 and twenty-three positive or negative 1s where the positions of the –1s form a C-set if the +5 is used and the positions of the –1s together with the position of the 5 form a C-set if –5 is used.

FIG. 1 lists the steps of lattice-quantizing a 24-long data point for transmission. The first step 101 is to acquire a 24 dimensional data point $x=(x_1, x_2, \ldots, x_{24})$. The second step 102 is to multiply each coordinate of the data point by $\sqrt{8}$ to form an inflated data point $y=(y_1, y_2, \ldots, y_{24})$. That is $y_1=x_1\sqrt{8}, \ldots, y_{24}=x_{24}\sqrt{8}$.

The third step 103 is to find the inflated Leech lattice point closest to $(y_1, y_2, \ldots, y_{24})$, the inflated data point, by any appropriate algorithm. A particularly fast algorithm is that of Alexander Vardy and Yair Be'ery discussed in "*Maximum Likelihood Decoding of the Leech lattice*," IEEE TRANS- ACTIONS ON INFORMATION THEORY, Vol. 39, No. 4, July 1993, pp. 1435–1444. Any other algorithm for finding the closest points of the inflated Leech lattice can also be used.

The next step 104 is to determine the shell number and type number of the inflated Leech lattice point.

The next step 105 is to go to step 112 if the inflated Leech lattice point is in shell 2 and of type 3. The following steps, 106 through 111, for determining the extended Golay codeword encoding the inflated Leech lattice point are not required for an inflated Leech lattice point in shell 2 or type 3.

The next step 106 is to determine the C-set of the inflated Leech lattice point.

The next step 107 is to form an extended Golay codeword from the C-set by substituting 1s in the positions of the C-set and 0s elsewhere.

The next step 108 is to determine if the weight of the resulting codeword, if it contains a 0 in the last bit, is greater than 12 or, if it contains a 1 in the last bit, is equal to 12. If so, complement the codeword.

The next step 109 is to circularly shift the first 23 bits of the codeword until the codeword is the smallest binary number achievable through such shifting and record the number of shifts required.

The next step 110 is to find, for the not-all-zeros codeword, the resulting codeword in the stored indexed list of 89 codewords. As will be seen below, these codewords are recalled by the index, which is referred to as the codeword position number.

The position number is set to 0 for the all-zeros codeword in the next step 111.

The final step 112 is to prepare the inflated Leech lattice point for transmission. The steps for preparing the inflated Leech lattice point are described in FIGS. 2–8.

Figure 16A:
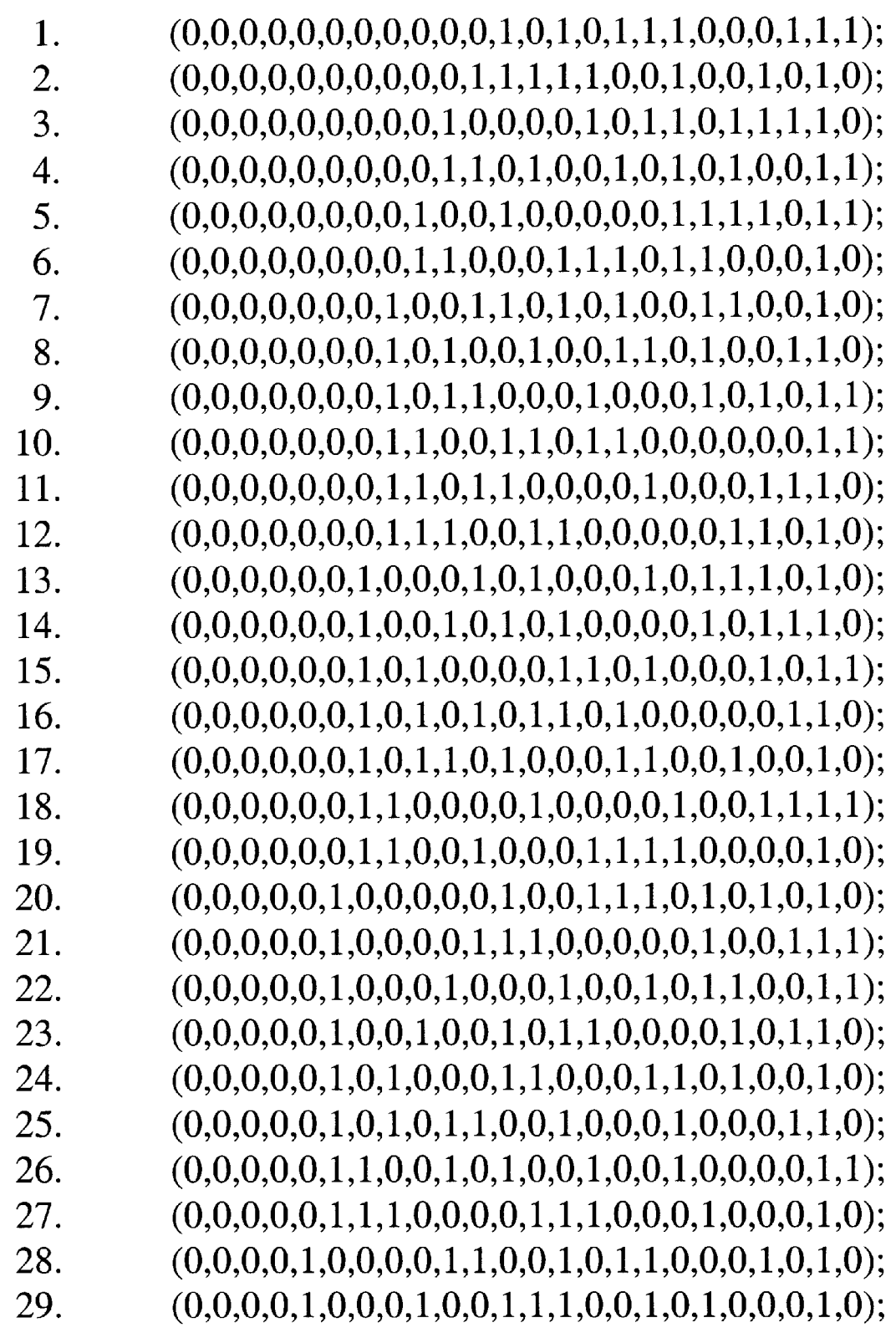
Figure 16B:
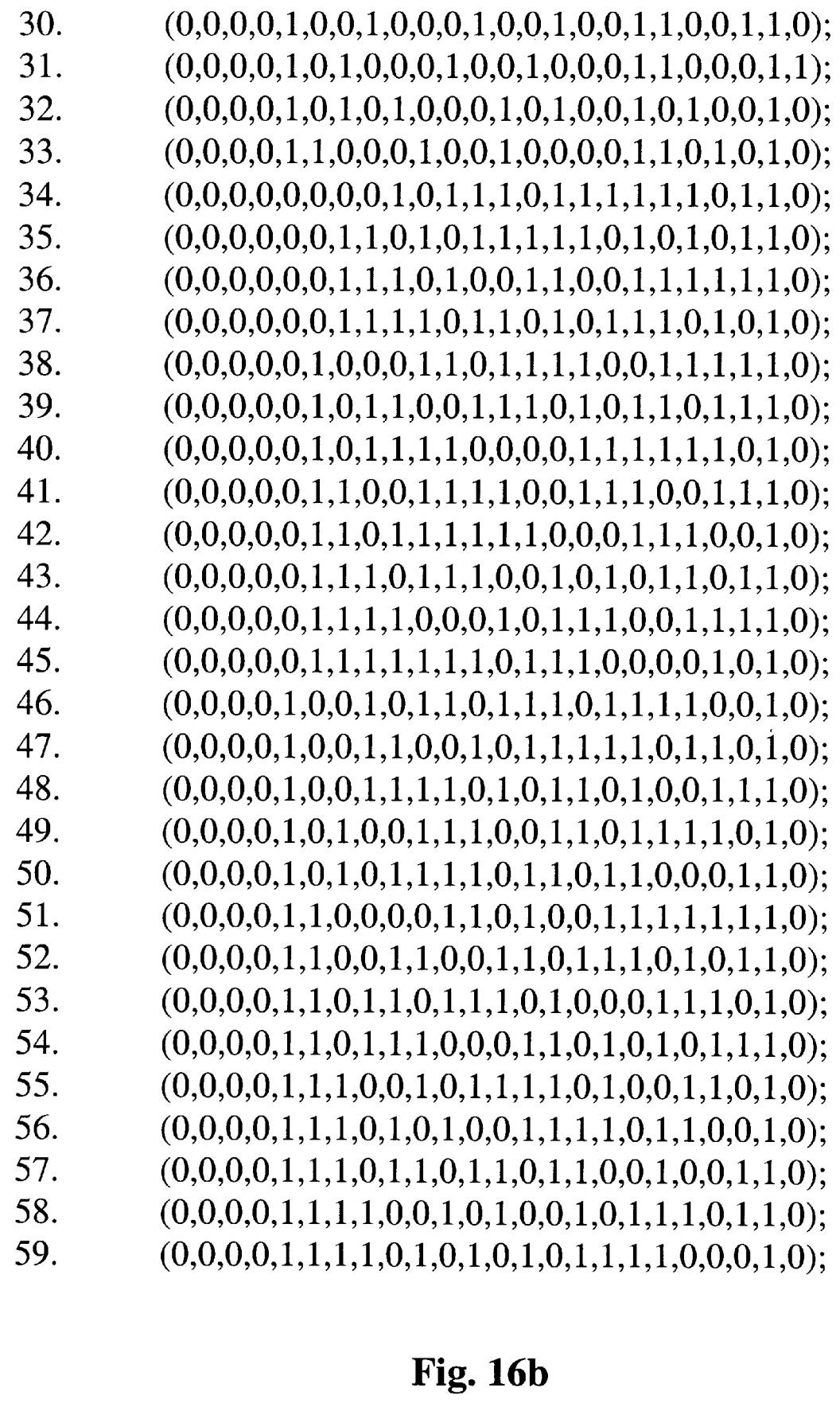

The lattice of the present invention is based on the 24-long extended Golay code. This code has 4096 codewords but only 89 need to be stored. These 89 codewords are listed in FIGS. 16a–16c.

Position numbers are given to the codewords because it takes fewer bits to transmit the position of a codeword (i.e. 7 bits) than to transmit all 24 bits of the codeword. Given the C-set associated with a lattice point we get a codeword in the extended Golay code by putting a 1 in each position determined by the C-set.

If the codeword is all 0s we transmit seven 0s, if it is all 1s, it is the complement of the all 0s codeword. If it is an octad (weight 8), we circular shift the first 23 bits to the left leaving the last one bit fixed. (i.e. $(a_1, a_2, \ldots, a_{23}, a_{24}) \Rightarrow (a_2, a_3, \ldots, a_{23}, a_1, a_{24})$, Note that the direction of the shift is unimportant, i.e. 22 right shifts=1 left shift. The opposite shift direction chosen for transmission is used for reception.). This is also a codeword of the extended Golay code. We continue to shift until we have the minimum binary number. This appears on the list as one of the first 33 entries. The position number in binary is transmitted using 7 bits or 6 bits in the cases where only octads are possible. We also use 5 bits to transmit the number of left shifts needed (0 to 22). At the receiver we shift to the right to reconstruct. If the codeword has weight 16, we complement it and then apply the procedure for octads. A bit is transmitted to indicate if the codeword is an octad or a complemented word of weight 16.

If the codeword is a dodecad (weight 12) we complement it if the last bit is a 1. A bit is transmitted to indicate if the codeword is complemented. We circular shift the first 23 bits to the left leaving the last bit fixed. This is also a codeword of the extended Golay code. We continue to shift until we have the minimum binary number. The position number in binary is transmitted using 7 bits. This appears on the list of 89 codewords, shown in FIGS. 16a–c, as one of the entries from 34 to 89. We also use 5 bits to transmit the number of left shifts needed (0 to 22). At the receiver we shift to the right to reconstruct. In this way we account for all 4096 possible codewords of the extended Golay code.

Any other numbering scheme may be used and different octads or dodecads may be used as long as no two elements on the list are complements of each other or are related by the shifts described above. Also the 33 octads could be replaced by 33 words of weight 16.

TRANSMISSION OF A SHELL 2, TYPE 1, LATTICE POINT

Figure 2:
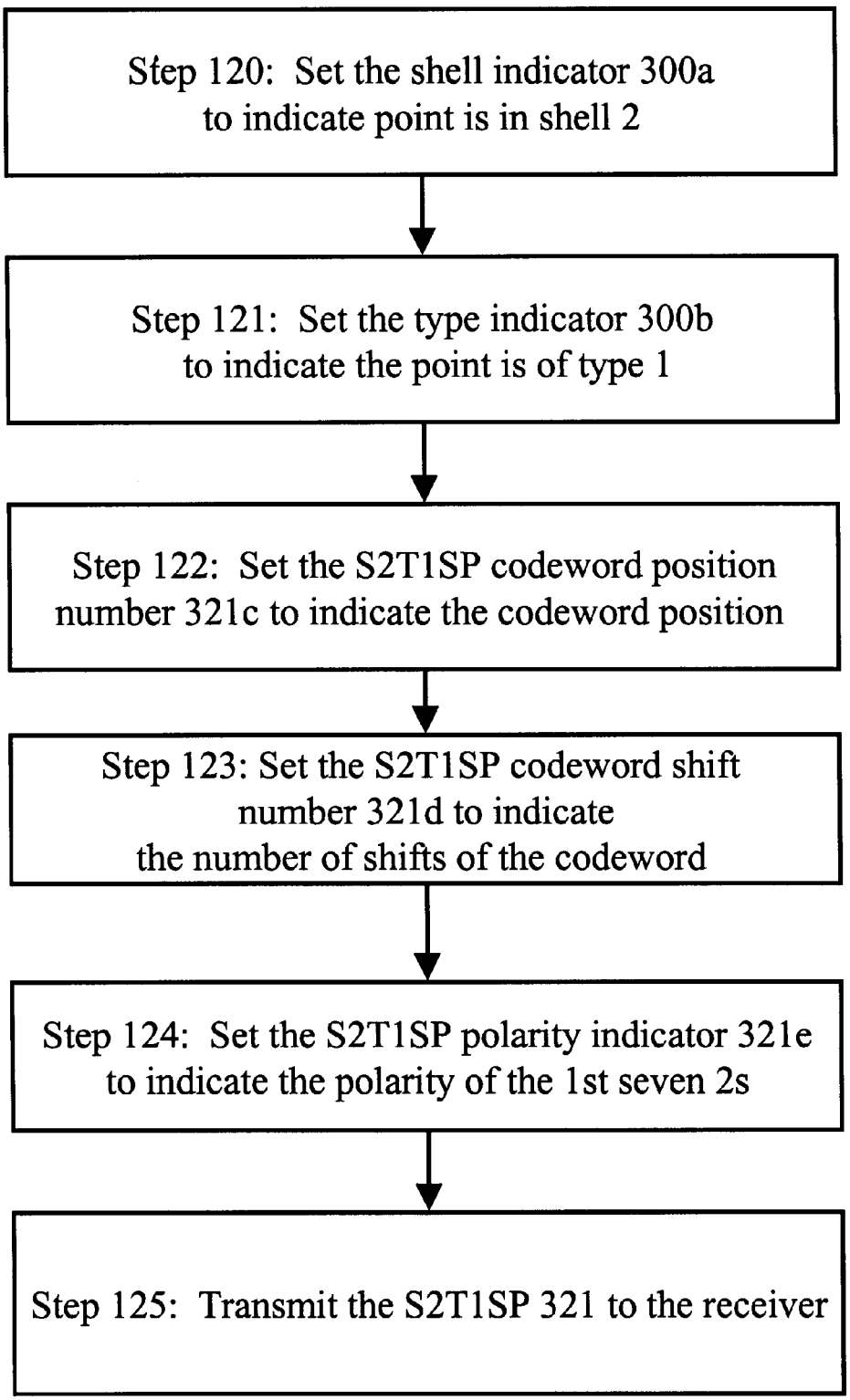
FIG. 2 is a list of steps for transmitting a signal packet for a type 1 lattice point in shell 2 according to a method of the present invention.
Figure 17:
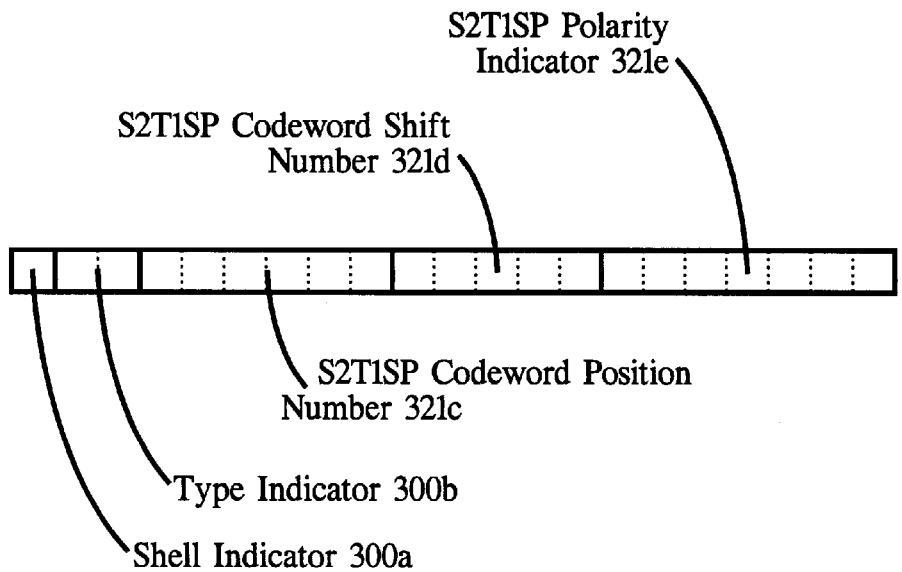
FIG. 17 is an example representation of a signal packet for a type 1 lattice point in shell 2 according to a method of the present invention.

FIG. 2 lists the steps, 120 through 125, for transmitting a lattice point of type 1 in shell 2 as a shell 2, type 1 signal packet (S2T1SP) 321. The S2T1SP 321 is shown in FIG. 17. A type 1 point in shell 2 contains eight positive or negative 2s and sixteen 0s, where the positions of the 2s form a C-set and there is an even number of −2s.

The first step 120 in preparing this point for transmission is to set 1 bit, the shell indicator 300a, to indicate the point is in shell 2. All points must be in shell 2 or shell 3, as discussed above.

The next step 121 is to set 2 bits, the type indicator 300b, to indicate the point is of type 1. Only two bits are required to differentiate between the three possible types, one, two, or three, in shell 2.

The next step 122 is to set 6 bits, the S2T1SP codeword position number 321c, to indicate the codeword position number. Only 6 bits are needed since only octads are possible and there are only 33 possible octads.

The next step 123 is to set 5 bits, the S2T1SP codeword shift number 321d, to indicate the number of shifts, from 0 to 22.

The next step 124 is to set 7 bits, the S2T1SP polarity indicator 321e, to indicate the polarity of the first seven 2s. As there are an even number of −2s the polarity of the eighth 2 can be determined from the polarity of the first seven 2s.

The last step 125 is to transmit the 21 bits, described above, in steps 120 through 124, to the receiver, as an S2T1SP 321. The receiver will receive the S2T1SP 321, recover the intended inflated lattice point, and then deflate it in order to recover the intended data point. The steps for recovering the intended data point of type 1 in shell 2 are described below, in steps 201 through 207, and listed in FIG. 9.

TRANSMISSION OF A SHELL 2, TYPE 2, LATTICE POINT

Figure 3:
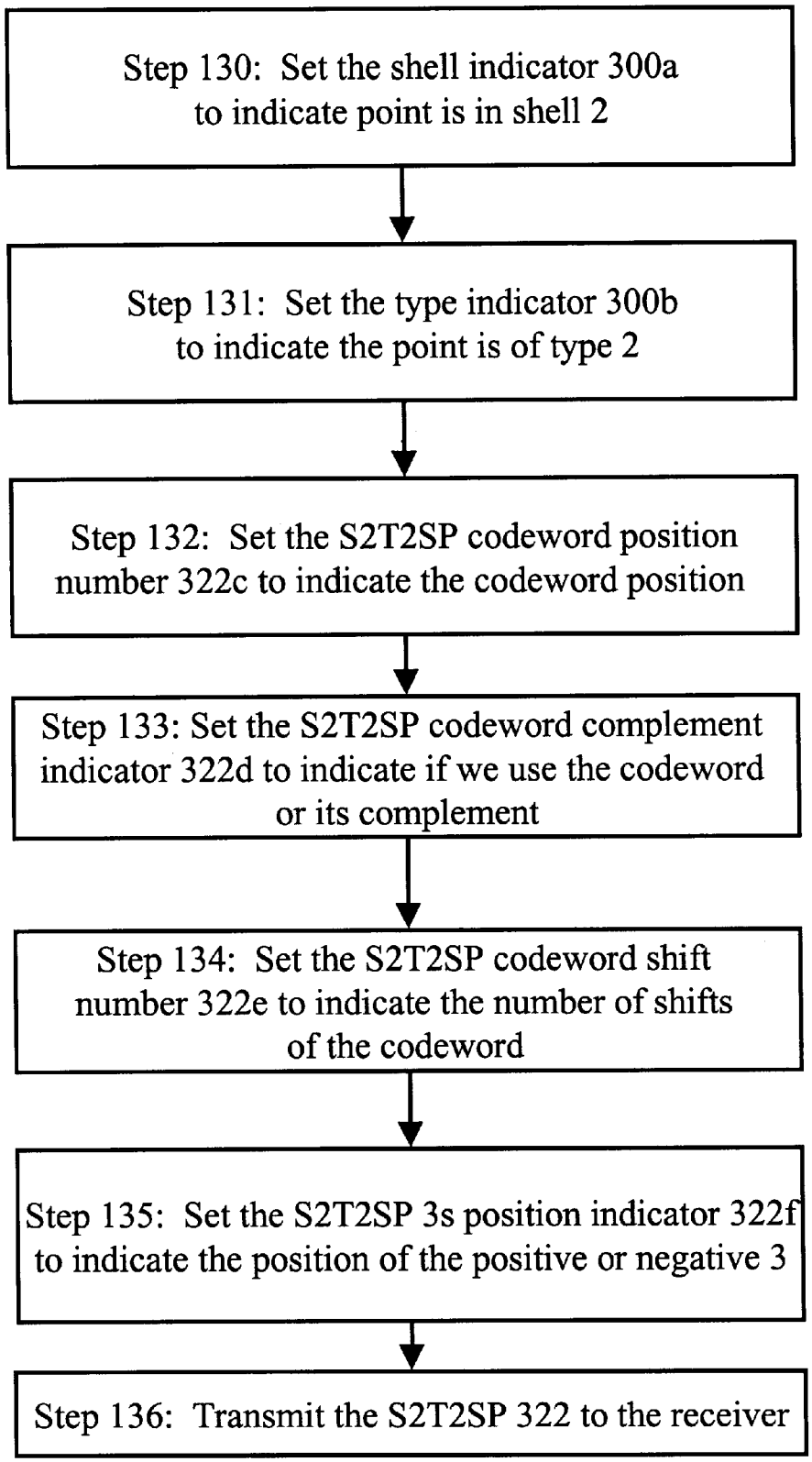
FIG. 3 is a list of steps for transmitting a signal packet for a type 2 lattice point in shell 2 according to a method of the present invention.
Figure 18:
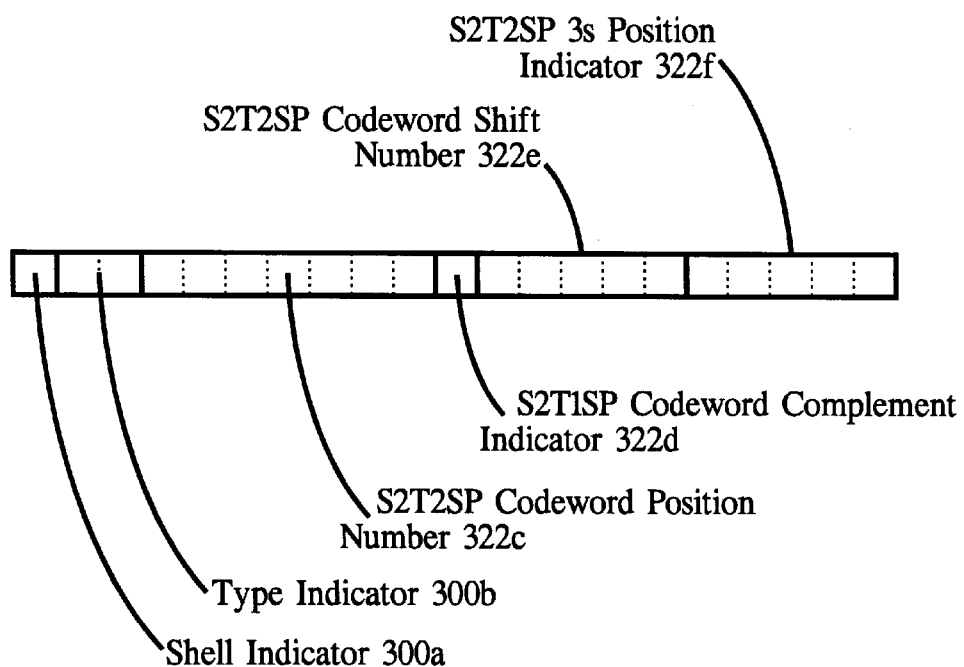
FIG. 18 is an example representation of a signal packet for a type 2 lattice point in shell 2 according to a method of the present invention.

FIG. 3 lists the steps, 130 through 136, for transmitting a lattice point of type 2 in shell 2 as a shell 2, type 2 signal packet (S2T2SP) 322. The S2T2SP 322 is shown in FIG. 18. A type 2 point in shell 2 contains one positive or negative 3 and twenty-three positive or negative 1s where the positions of the −1s form a C-set if the −3 is used and the positions of the −1s together with the position of the 3 form a C-set if +3 is used.

The first step 130 in preparing this point for transmission is to set 1 bit, the shell indicator 300a, to indicate the point is in shell 2. All points must be in shell 2 or shell 3, as discussed above.

The next step 131 is to set 2 bits, the type indicator 300b, to indicate the point is of type 2. Only two bits are required to differentiate between the three possible types, one, two, or three, in shell 2.

The next step 132 is to set 7 bits, the S2T2SP codeword position number 322c, to indicate the codeword position number, which can range from 0 to 89.

The next step 133 is to set 1 bit, the S2T2SP codeword complement indicator 322d, to indicate if we use this codeword or its complement.

The next step 134 is to set 5 bits, the S2T2SP codeword shift number 322e, to indicate the number of shifts, which can range from 0 to 22, as described above.

The next step 135 is to set 5 bits, the S2T2SP 3s position indicator 322f, to indicate the position of the positive or negative 3, which can range from 0 to 23.

The last step 136 is to transmit the 21 bits described above, in steps 130 through 135, to the receiver, as an S2T2SP 322. The receiver will receive the S2T2SP 322, recover the intended inflated lattice point, and then deflate it in order to recover the intended data point. The steps for recovering the intended data point of type 2 in shell 2 are described below, in steps 211 through 218, and listed in FIG. 10.

TRANSMISSION OF A SHELL 2, TYPE 3, LATTICE POINT

Figure 4:
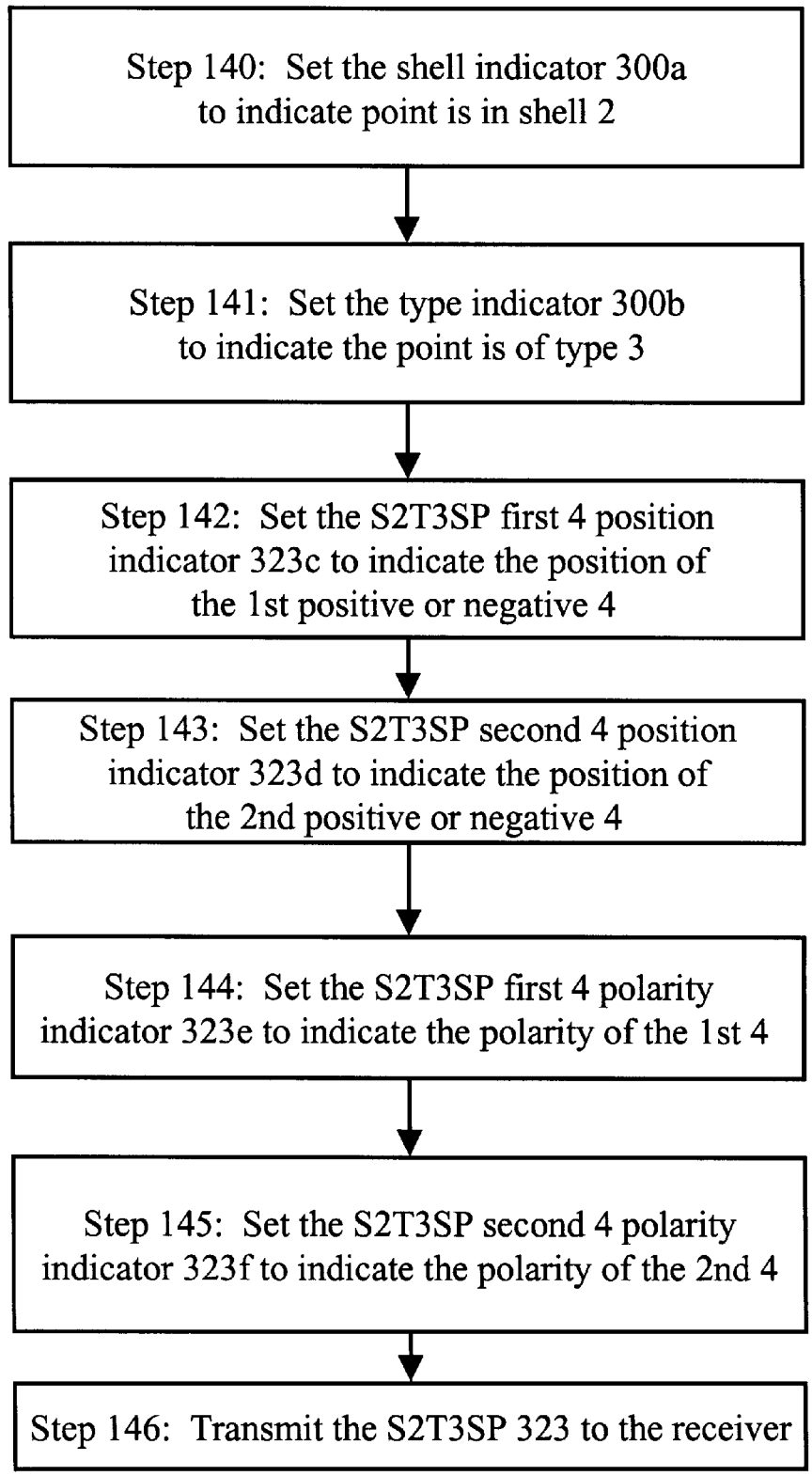
FIG. 4 is a list of steps for transmitting a signal packet for a type 3 lattice point in shell 2 according to a method of the present invention.
Figure 19:
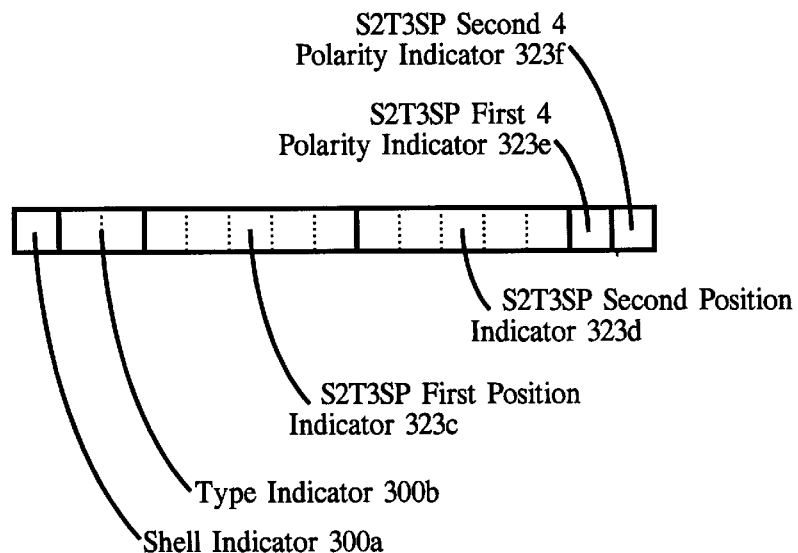
FIG. 19 is an example representation of a signal packet for a type 3 lattice point in shell 2 according to a method of the present invention.

FIG. 4 lists the steps, 140 through 146, for transmitting a lattice point of type 3 in shell 2 as a shell 2, type 3 signal packet (S2T3SP) 323. The S2T3SP is shown in FIG. 19. A type 3 point in shell 2 contains two positive or negative 4s and twenty-two 0s.

The first step 140 in preparing this point for transmission is to set 1 bit, the shell indicator 300a, to indicate the point is in shell 2. All points must be in shell 2 or shell 3, as discussed above.

The next step 141 is to set 2 bits, the type indicator 300b, to indicate the point is of type 3. Only two bits are required to differentiate between the three possible types, one, two, or three, in shell 2.

The next step 142 is to set 5 bits, the S2T3SP first 4 position indicator 323c, to indicate the position of the first positive or negative 4, from position 0 to position 23.

The next step 143 is to set 5 bits, the S2T3SP second 4 position indicator 323d, to indicate the position of the second positive or negative 4, from position 1 to position 23 (The 0 position is not possible for the second 4 since if a positive or negative 4 were in that position it would have to be the first 4).

The next step 144 is to set 1 bit, the S2T3SP first 4 polarity indicator 323e, to indicate the polarity of the first 4.

The next step 145 is to set 1 bit, the S2T3SP second 4 polarity indicator 323f, to indicate the polarity of the second 4.

The last step 146 is to transmit the 15 bits described above, in steps 140 through 145, to the receiver, as an S2T3SP 323. The receiver will receive the S2T3SP, recover the intended inflated lattice point, and then deflate it in order to recover the intended data point. The steps for recovering the intended data point of type 3 in shell 2 are described below, in steps 221 through 226, and listed in FIG. 11.

TRANSMISSION OF A SHELL 3, TYPE 1, LATTICE POINT

Figure 5:
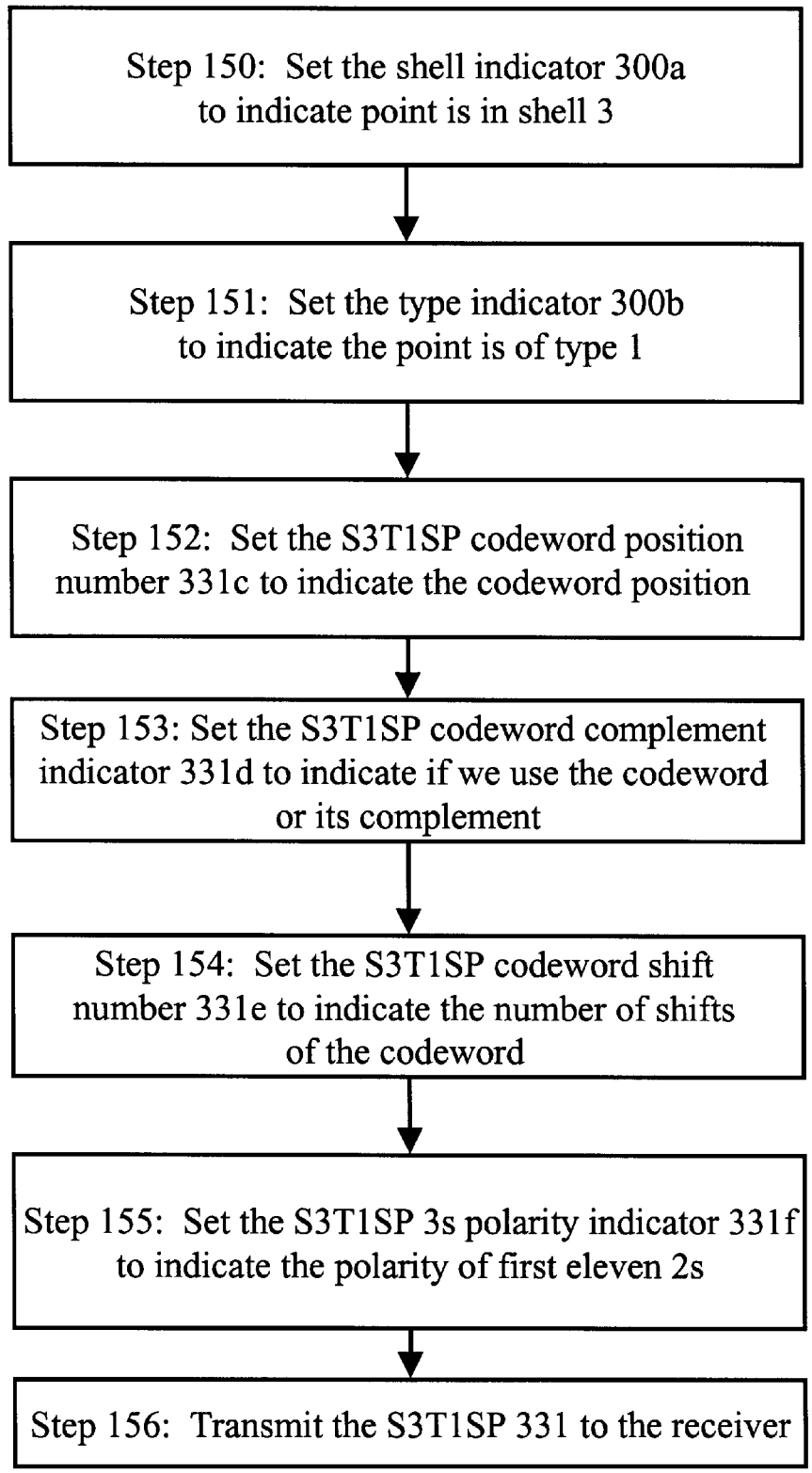
FIG. 5 is a list of steps for transmitting a signal packet for a type 1 lattice point in shell 3 according to a method of the present invention.
Figure 20:
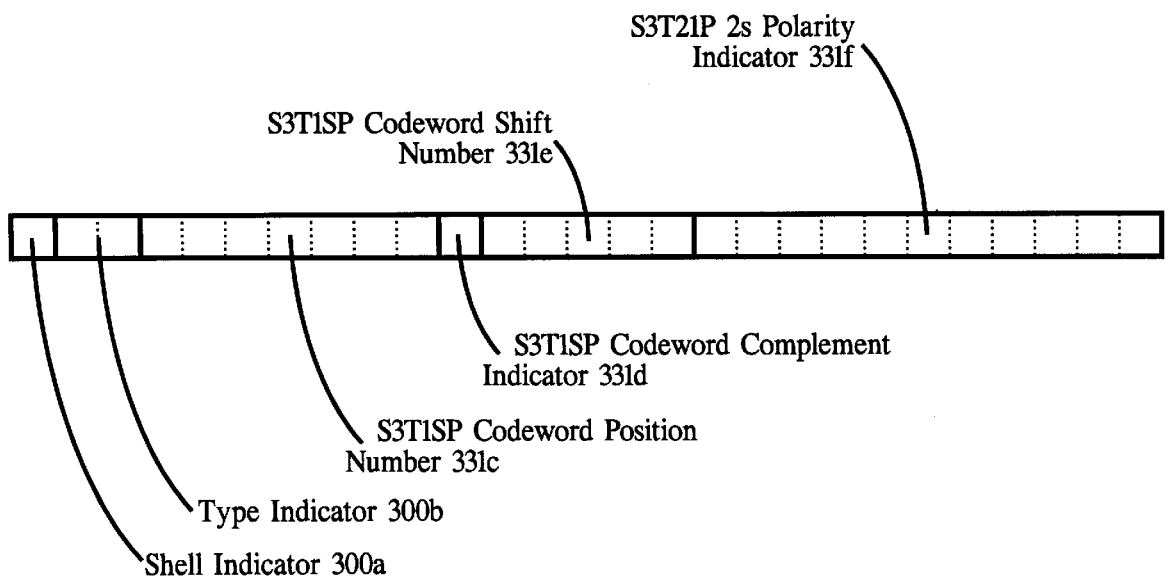
FIG. 20 is an example representation of a signal packet for a type 1 lattice point in shell 3 according to a method of the present invention.

FIG. 5 lists the steps, 150 through 156, for transmitting a lattice point of type 1 in shell 3 as a shell 3, type 1 signal packet (S3T1SP) 331. The S3T1SP 331 is shown if FIG. 20. A type 1 point in shell 3 contains twelve positive or negative 2s and twelve 0s where the positions of the 2s form a C-set and there are an even number of −2s.

The first step 150 in preparing this point for transmission is to set 1 bit, the shell indicator 300a to indicate the point is in shell 3. All points must be in shell 2 or shell 3, as discussed above.

The next step 151 is to set 2 bits, the type indicator 300b, to indicate the point is of type 1. Only two bits are required to differentiate between the four possible types, one, two, three, or four, in shell 3.

The next step 152 is to set 7 bits, the S3T1SP codeword position number 331c, to indicate the codeword position number, which can range from 34 to 89.

The next step 153 is to set 1 bit, the S3T1SP codeword complement indicator 331d, to indicate if we use this codeword or its complement.

The next step 154 is to set 5 bits, the S3T1SP codeword shift number 331e, to indicate the number of shifts, which can range from 0 to 22, as described above.

The next step 155 is to set 11 bits, the S3T1SP 2s polarity indicator 331f, to indicate the polarity of the first eleven 2s. As there are an even number of −2s the polarity of the twelfth 2 can be determined from the polarity of the first eleven 2s.

The last step 156 is to transmit the 27 bits described above, in steps 150 through 155, to the receiver, as an S3T1SP 331. The receiver will receive the S3T1SP 331, recover the intended inflated lattice point, and then deflate it in order to recover the intended data point. The steps for recovering the intended data point of type 1 in shell 3 are described below, in steps 231 through 238, and listed in FIG. 12.

TRANSMISSION OF A SHELL 3, TYPE 2, LATTICE POINT

Figure 6:
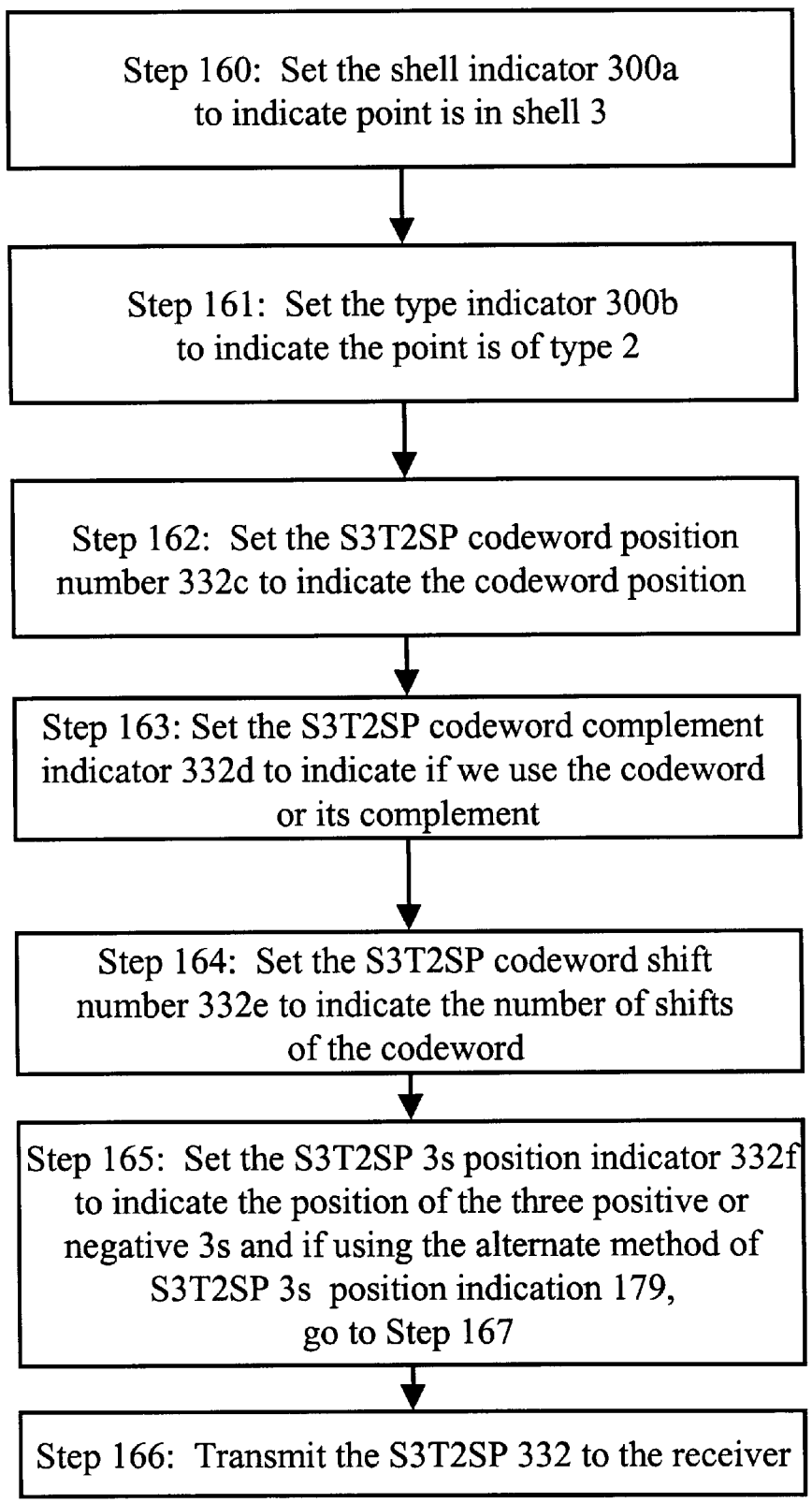
FIG. 6 is a list of steps for transmitting a signal packet for a type 2 lattice point in shell 3 according to a method of the present invention.

FIG. 6 lists the steps, 160 through 166, for transmitting a lattice point of type 2 in shell 3 as a shell 3, type 2 signal packet (S3T2SP) 332. The S3T2SP 332 is shown in FIG. 21. A type 2 point in shell 3 contains three positive or negative 3s and twenty-one positive or negative 1s where the positions of the −1s and +3s (if any) form a C-set.

The first step 160 in preparing this point for transmission is to set 1 bit, the shell indicator 300a, to indicate the point is in shell 3. All points must be in shell 2 or shell 3, as discussed above.

The next step 161 is to set 2 bits, the type indicator 300b, to indicate the point is of type 2. Only two bits are required to differentiate between the four possible types, one, two, three, or four, in shell 3.

The next step 162 is to set 7 bits, the S3T2SP codeword position number 332c, to indicate the codeword position number, which can range from 0 to 89.

The next step 163 is to set 1 bit, the S3T2SP codeword complement indicator 332d, to indicate if we use this codeword or its complement.

The next step 164 is to set 5 bits, the S3T2SP codeword shift number 332e, to indicate the number of shifts, which can range from 0 to 22, as described above.

The next step 165 is to set 15 bits, the S3T2SP 3s position indicator 332f, to indicate the position of the three positive or negative 3s, which can range from 0 to 23, in the simple method of S3T2SP 3s position indication 178, or go to step 167 for an alternate method of S3T2SP 3s position indication 179.

The last step 166 is to transmit the 31 bits described above, in steps 160 through 165, to the receiver as an S3T2SP 332. The receiver will receive the S3T2SP 332, recover the intended inflated lattice point, and then deflate it in order to recover the intended data point. The steps for recovering the intended data point of type 2 in shell 3 are described below, in steps 241 through 265, and listed in FIG. 13.

ALTERNATE METHOD OF S3T2SP 3s POSITION INDICATION 179

Figure 6A:
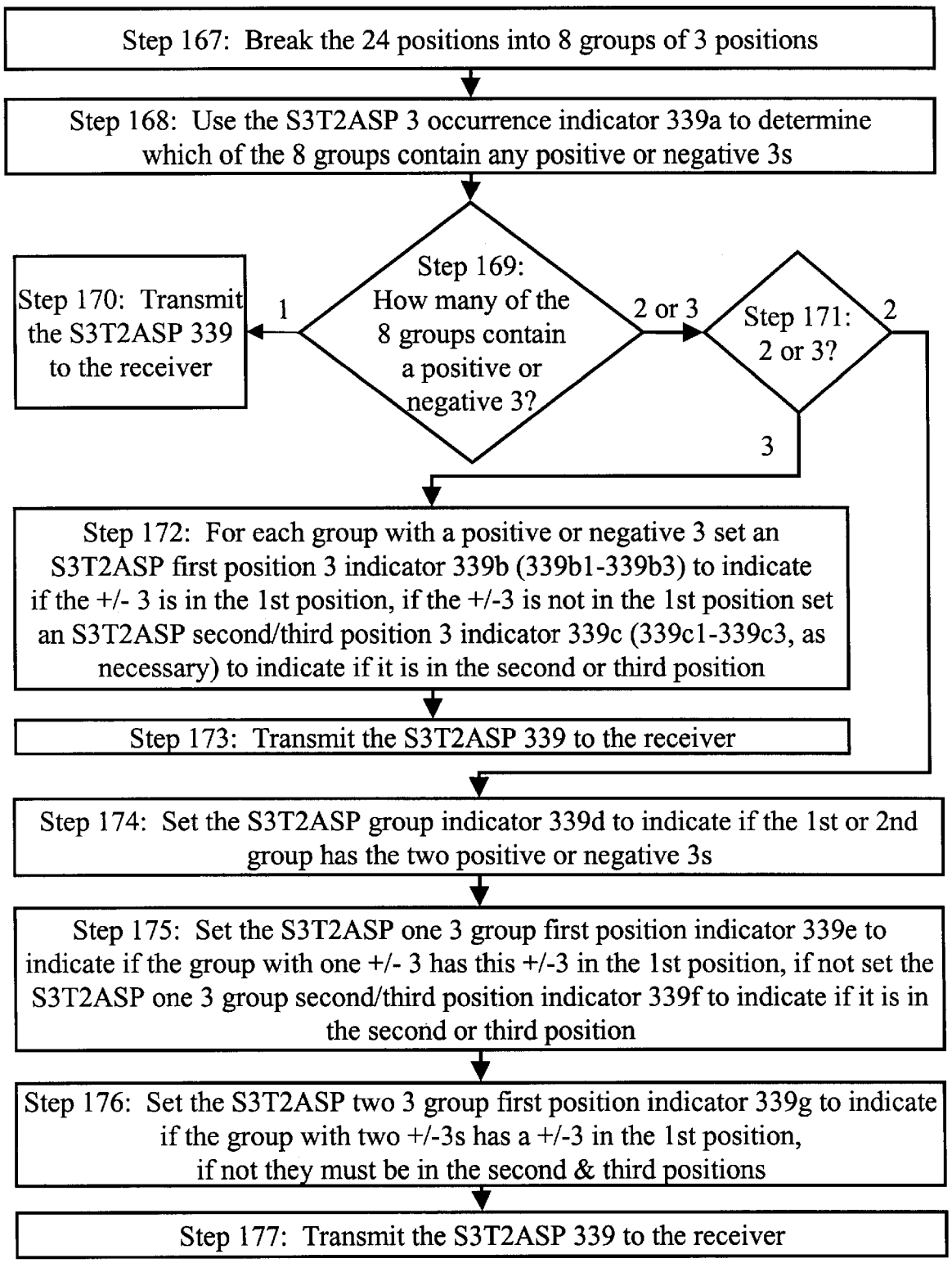
FIG. 6a is a list of steps for transmitting a signal packet for a type 2 lattice point in shell 3 according to an alternate method of the present invention.

FIG. 6a lists the steps, 167 through 177, for transmitting a lattice point of type 2 in shell 3, using an alternate method of S3T2SP 3s position indication 179, as a shell 3, type 2 alternate signal packet (S3T2ASP) 339. The alternate method of S3T2SP 3s position indication 179 is more complicated than the simple method of S3T2SP 3s position indication 178 but always takes fewer than the 15 bits of the simple method of S3T2SP 3s position indication 178, thereby allowing for the transmission of a shell 3, type 2 lattice point in fewer than the 31 bits required using steps 160 through 166.

The shell indicator 300a, type indicator 300b, S3T2SP codeword position number 332c, S3T2SP codeword complement indicator 332d, and the S3T2SP codeword shift number 332e, are determined for the S3T2ASP 339 exactly like for the S2T2SP 332, as described in steps 160 through 164 above, and shown in FIG. 21.

The first step 167 in the alternate method of S3T2SP 3s position indication 179 is to break the 24 coordinates of the inflated shell 3, type 2 lattice point into 8 groups of 3 positions each, using any method. The simplest method would be to make a group out of each of 8 groups of 3 consecutive positions.

The next step 168 is to use 8 bits, the S3T2ASP 3 occurrence indicator 339a, 1 bit for each of the 8 groups of 3 positions, to indicate if it contains any positive or negative 3s.

EXACTLY ONE GROUP CONTAINS POSITIVE OR NEGATIVE 3s

The next step 169 is to check if exactly one of these 8 groups of 3 positions contains a positive or negative 3. If so, go to step 170, otherwise, go to step 171.

The last step 170 in this case, where exactly one of the 8 groups of 3 positions contains a positive or negative 3, is to transmit the S3T2ASP 339 (shown in FIG. 22a), consisting of the shell indicator 300a, type indicator 300b, S3T2SP codeword position number 332c, S3T2SP codeword complement indicator 332d, the S3T2SP codeword shift number 332e, and S3T2ASP 3 occurrence indicator 339a, totaling 24 bits, to the receiver and stop. Since there are three 3s contained in one group of three positions the transmission of the S3T2ASP 339 is complete.

THREE GROUPS CONTAIN POSITIVE OR NEGATIVE 3s

The next step 171 is to check to see if exactly three of these 8 groups of 3 positions contain a positive or negative 3. If so, go to step 172. Otherwise, go to step 174.

The next step 172 is as follows: For each of the 3 of the 8 groups of 3 positions with a positive or negative 3, 1 bit, an S3T2ASP first position 3 indicator 339b, is used to indicate if the 3 is in the first position. These three S3T2ASP first position 3 indicators 339b are labeled 339b1–339b3. If the positive or negative 3 is not in the first position, 1 bit, an S3T2ASP second/third position 3 indicator 339c, is used to indicate if it is in the second or third position.

These S2T2ASP second/third position 3 indicators 339c are labeled 339c1 up to 339c3, as necessary, as shown in FIG. 22b.

The last step 173 in this case, where exactly three of these 8 groups of 3 positions have a positive or negative 3, is to transmit the S3T2ASP 339 (shown in FIG. 22b), consisting of the shell indicator 300a, type indicator 300b, S3T2SP codeword position number 332c, S3T2SP codeword complement indicator 332d, the S3T2SP codeword shift number 332e, S3T2ASP 3 occurrence indicator 339a, three S3T2ASP first position 3 indicators 339b1–339b3, and up to three S3T2ASP second/third position 3 indicators 339c, totaling from 27 to 30 bits, to the receiver and stop.

ONE GROUP HAS ONE AND ONE GROUP HAS TWO POSITIVE OR NEGATIVE 3s

The next step 174 applies when one of these 8 groups of 3 positions has two positive or negative 3s and one has one positive or negative 3. As shown in FIG. 22c, one bit, the S3T2ASP group indicator 339d, is used to indicate if the first or the second of the two groups has the two positive or negative 3s.

The next step 175 is to use 1 bit, the S3T2ASP one 3 group first position indicator 339e, to indicate if the group with one positive or negative 3 has this positive or negative three in the first position. If not, 1 bit, the S3T2ASP one 3 group second/third position indicator 339f, is used to indicate if it is in the second or the third position.

The next step 176 is to use 1 bit, the S3T2ASP two 3 group first position indicator 339g, to indicate if the group with two positive or negative 3s has a positive or negative three in the first position. If not, the signal packet is complete since the two positive or negative 3s must be in the second and third positions. If there is a positive or negative 3 in the first position, 1 bit, the S3T2ASP two 3 group second/third position indicator 339h, is used to indicate if the other positive or negative 3 is in the second or the third position.

The last step 177 in this case, where one of the 8 groups has two positive or negative 3s and one has one positive or negative 3, is to transmit the S3T2ASP 339 (shown in FIG. 22c), consisting the shell indicator 300a, type indicator 300b, S3T2SP codeword position number 332c, S3T2SP codeword complement indicator 332d, the S3T2SP codeword shift number 332e, S3T2ASP 3 occurrence indicator 339a, S3T2ASP group indicator 339d, S3T2ASP one 3 group first position indicator 339e, one S3T2ASP one 3 group second/third position indicator 339f, if necessary, the S3T2ASP two 3 group first position indicator 339g, and the S3T2ASP two 3 group second/third position indicator 339h, if necessary, totaling from 27 to 29 bits, to the receiver and stop. The receiver will receive the S3T2ASP 339, recover the intended inflated lattice point, and then deflate it in order to recover the intended data point. The steps for recovering the intended data point of type 2 in shell 3 are described below, in steps 241 through 265, and listed in FIG. 13.

Remembering that the 3s can be positive or negative; as an illustration of the two methods for coding the positions of the three 3s, the simple method of S3T2SP 3s position indication 178 and the alternate method of S3T2SP 3s position indication 179, consider the following example. Suppose our inflated lattice point is:

(−3, 1, 1, −1, 1, −1, −1, 1, 1, −1, 1, 1, −1, 1, −1, −1, 3, 3, −1, −1, 1, 1, −1, 1)

The simple method of S3T2SP 3s position indication 178 is as follows: Number the positions from 0 to 23. The 3s are in positions 0, 16, 17 so the S3T2SP 3s position indicator 332*f* can be encoded as 00000 10000 10001 and use 15 bits.

By the alternate method of S3T2SP 3s position indication 179, the inflated lattice point can be broken into 8 groups of 3 as follows:

(−3, 1, 1), (−1, 1, −1), (−1, 1, 1), (−1, 1, 1), (−1, 1, −1), (−1, 3, 3), (−1, −1, 1), and (1, −1, 1)

The groups having a 3 are marked with a 1 so, for example, 8 bit S3T2ASP 3 occurrence indicator 339*a*: 10000100 is transmitted.

There is now one group with two 3s and one group with one 3.

The 1 bit S3T2ASP group indicator 339*d* is transmitted to indicate the second of the 2 groups has the two 3s.

Looking at the group with 1 three, the 1 bit S3T2ASP one 3 group first position indicator 339*e* is transmitted indicating the 3 is in the first position. Looking at the group with two 3s, the S3T2ASP two 3 group first position indicator 339*g* is transmitted as not set indicating there is no 3 in the first position. The position of the three 3s is now fully indicated using 8+1+1+1=11 bits (S3T2ASP 3 occurrence indicator 339*a*+S3T2ASP group indicator 339*d*+bit S3T2ASP one 3 group first position indicator 339*e*+S3T2ASP two 3 group first position indicator 339*g*). This saves 4 bits over the 15 bits required to indicate the position of the three 3s with the S3T2SP 3s position indicator 332*f* of the simple method of S3T2SP 3s position indication 178.

TRANSMISSION OF A SHELL 3, TYPE 3, LATTICE POINT

Figure 7:
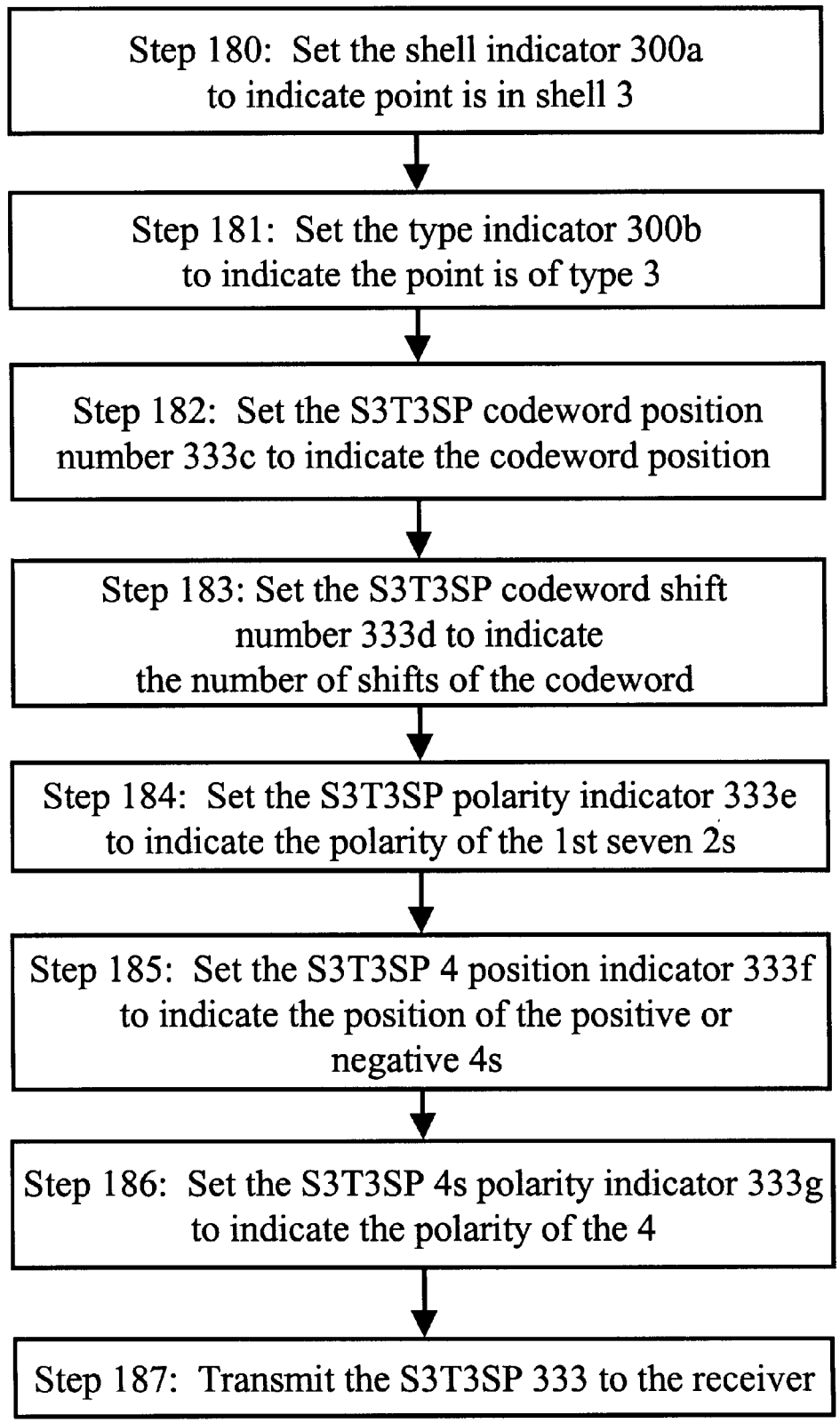
FIG. 7 is a list of steps for transmitting a signal packet for a type 3 lattice point in shell 3 according to a method of the present invention.
Figure 23:
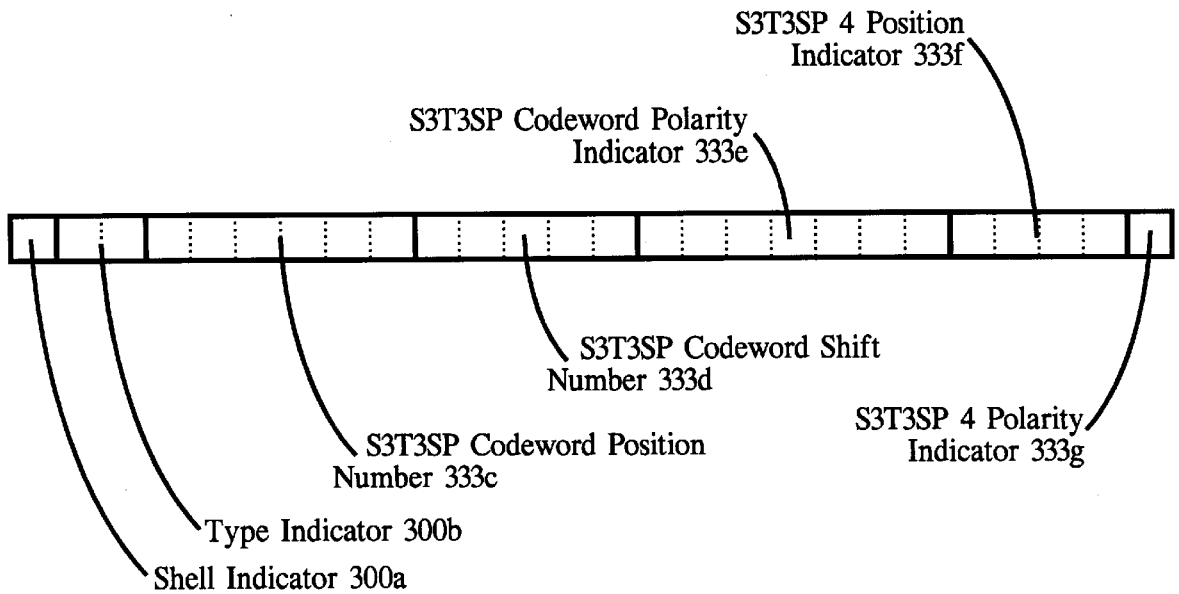
FIG. 23 is an example representation of a signal packet for a type 3 lattice point in shell 3 according to a method of the present invention.

FIG. 7 lists the steps, 180 through 187, for transmitting a lattice point of type 3 in shell 3 as a shell 3, type 3 signal packet (S3T3SP) 333. The S3T3SP 333 is shown in FIG. 23. A type 3 point in shell 3 contains one positive or negative 4, 8 positive or negative 2s and fifteen 0s, where the positions of the 2s form a C-set and there are an odd number of −2s.

The first step 180 in preparing this point for transmission is to set 1 bit, the shell indicator 300*a*, to indicate the point is in shell 3. All points must be in shell 2 or shell 3, as discussed above.

The next step 181 is to set 2 bits, the type indicator 300*b*, to indicate the point is of type 3. Only two bits are required to differentiate between the four possible types, one, two, three, or four, in shell 3.

The next step 182 is to set 6 bits, the S3T3SP codeword position number 333*c*, to indicate the codeword position number. Only 6 are needed since only octads are possible and there are only 33 possible octads.

The next step 183 is to set 5 bits, the S3T3SP codeword shift number 333*d*, to indicate the number of shifts, from 0 to 22.

The next step 184 is to set 7 bits, the S3T3SP polarity indicator 333*e*, to indicate the polarity of the first seven 2s.

The next step 185 is to set 4 bits, the S3T3SP 4 position indicator 333*f*, to indicate the position of the positive or negative 4. This can be in any of the 16 positions which does not have a 2.

The next step 186 is to set one bit, the S3T3SP 4 polarity indicator 333*g*, for the polarity of the 4.

The last step 187 of FIG. 7 is to transmit the 26 bits described above, in steps 180 through 186, to the receiver, as an S3T3SP 333. The receiver will receive the S3T3SP 333, recover the intended inflated lattice point, and then deflate it in order to recover the intended data point. The steps for recovering the intended data point of type 3 in shell 3 are described below, in steps 271 through 279, and listed in FIG. 14.

TRANSMISSION OF A SHELL 3, TYPE 4, LATTICE POINT

Figure 8:
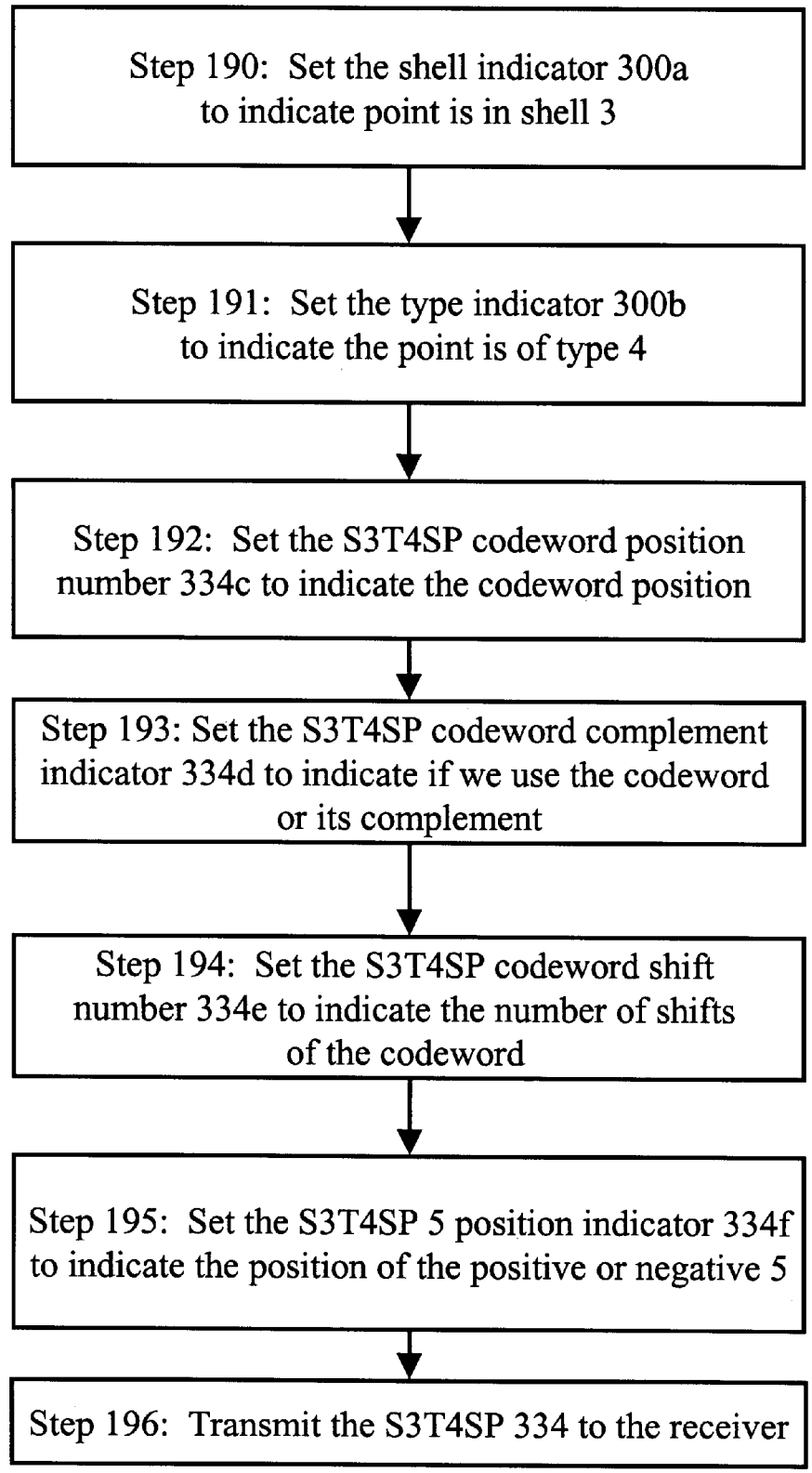
FIG. 8 is a list of steps for transmitting a signal packet for a type 4 lattice point in shell 3 according to a method of the present invention.
Figure 24:
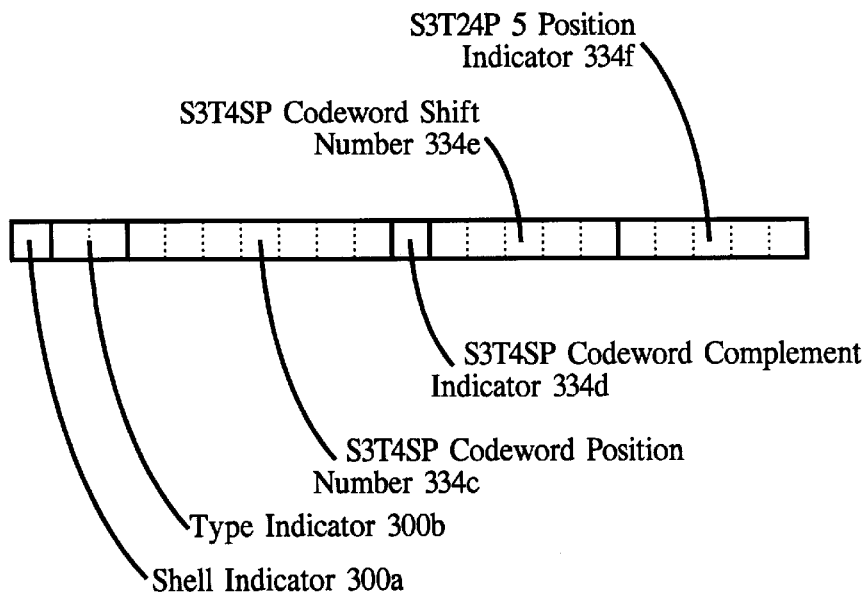
FIG. 24 is an example representation of a signal packet for a type 4 lattice point in shell 3 according to a method of the present invention.

FIG. 8 lists the steps, 190 through 196, for transmitting a lattice point of type 4 in shell 3 as a shell 3, type 4 signal packet (S3T4SP) 334. The S3T4SP 334 is shown in FIG. 24. A type 4 point in shell 3 contains one positive or negative 5 and twenty-three positive or negative 1s where the positions of the −1s form a C-set if the +5 is used and the positions of the −1s together with the position of the 5 form a C-set if −5 is used.

The first step 190 in preparing this point for transmission is to set 1 bit, the shell indicator 300*a*, to indicate the point is in shell 3. All points must be in shell 2 or shell 3, as discussed above.

The next step 191 is to set 2 bits, the type indicator 300*b*, to indicate the point is of type 4. Only two bits are required to differentiate between the four possible types, one, two, three, or four, in shell 3.

The next step 192 is to set 7 bits, the S3T4SP codeword position number 334*c*, to indicate the codeword position number, which can range from 0 to 89.

The next step 193 is to set 1 bit, the S3T4SP codeword compliment indicator 334*d*, to see if we use this codeword or its complement.

The next step 194 is to set 5 bits, the S3T4SP codeword shift number 334*e*, to indicate the number of shifts, which can range from 0 to 22, as described above. The next step 195 is to set 5 bits, the S3T4SP 5 position indicator 334*f*, to indicate the position of the positive or negative 5.

The last step 196 is to transmit the 21 bits described above, in steps 190 through 195, to the receiver, as an S3T4SP 334. The receiver will receive the S3T4SP 334, recover the intended inflated lattice point, and then deflate it in order to recover the intended data point. The steps for recovering the intended data point of type 4 in shell 3 are described below, in steps 281 through 288, and listed in FIG. 15.

RECEPTION OF LATTICE POINTS AND DETERMINATION OF SHELL AND TYPE

Once a signal packet, in one of the forms described above, S2T1SP 321, S2T2SP 322, S2T3SP 323, S3T1SP 331, S3T2SP 332, S3T2ASP 339, S3T3SP 333, or S3T4SP 334, transmitted in accordance with steps 125, 136, 146, 156, 166, 177, 187, or 196 respectively, is received by a receiver the receiver has to determine which type of inflated lattice point is represented by the received packet (i.e., type 1, 2, or 3 in shell 2 or type 1, 2, 3, or 4 in shell 3), reconstruct the inflated lattice point, and recover the data point from the rounded and inflated lattice point. The receiver must store and use the same 24-bit extended Golay Code table that was stored and used by the transmitter. The steps associated with receiving each type of transmission are listed below.

The first step after receiving a signal packet, transmitted in accordance with steps 125, 136, 146, 156, 166, 177, 187, or 196 is to determine, in step 200 (shown in FIG. 9) which type of inflated lattice point is represented by the received signal packet. In step 200, receive the signal packet, S2T1SP 321, S2T2SP 322, S2T3SP 323, S3T1SP 331, S3T2SP 332, S3T2ASP 339, S3T3SP 333, or S3T4SP 334, read the shell indicator 300a and type indicator 300b contained therein, determine the shell and type of the inflated lattice point represented by the received signal packet, and if the inflated lattice point represented by the received signal packet is of:

shell 2, type 1, go to step 201 (the signal packet is an S2T1SP 321);

shell 2, type 2, go to step 211 (the signal packet is an S2T2SP 322);

shell 2, type 3, go to step 221 (the signal packet is an S2T3SP 323);

shell 3, type 1, go to step 231 (the signal packet is an S3T1SP 331);

shell 3, type 2, go to step 241 (the signal packet is an S3T2SP 332, if using the simple method of S3T2SP 3s position indication 178, or an S3T2ASP 339 if using the alternate method of S3T2SP 3s position indication 179);

shell 3, type 3, go to step 271 (the signal packet is an S3T3SP 333); or shell 3, type 4, go to step 281 (the signal packet is an S3T4SP 334).

RECEPTION OF A SHELL 2, TYPE 1, LATTICE POINT

Figure 9:
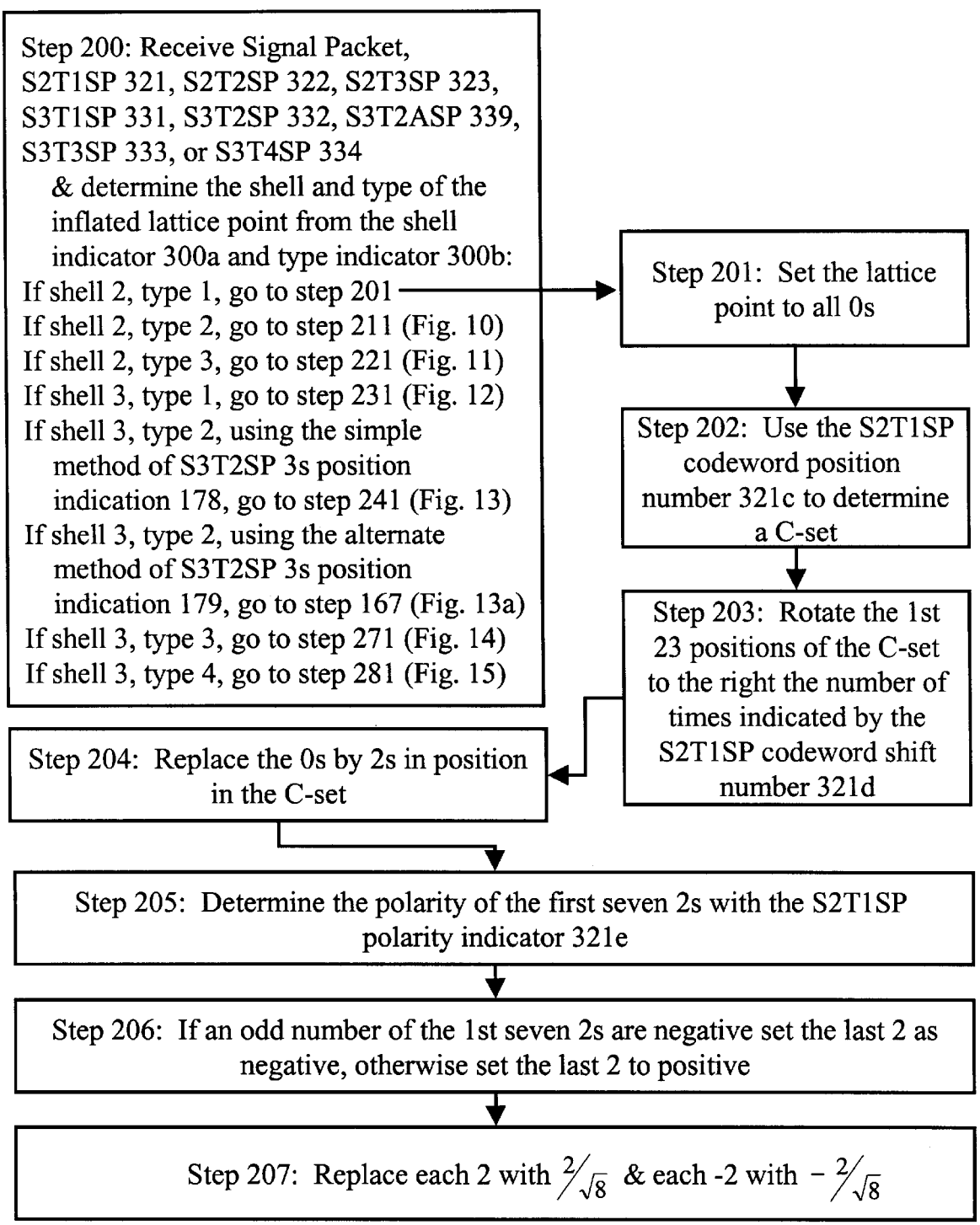
FIG. 9 is a list of steps for determining which shell and type of inflated lattice point is represented by a received signal packet and the steps for decoding a signal packet for a type 1 lattice point in shell 2 according to a method of the present invention.

FIG. 9 lists the steps, 201 through 207, that a receiver must perform in order to reconstruct a data point from a signal packet representing a type 1 lattice point in shell 2, an S2T1SP 321.

The first step 201 is to let the lattice point consist of all 0s.

The next step 202 is to use the S2T1SP codeword position number 321c (6 bits) as an index to the stored codeword table, taken from the extended Golay code, to determine a C-set.

The next step 203 is to rotate the first 23 positions of the C-set to the right the number of times determined by the S2T1SP codeword shift number 321d (5 bits) in order to form a new C-set. (Right shifts are used for example throughout. Left shifts would be used if right shifts had been used for transmission.)

The next step 204 is to replace the 0s by 2s in the positions of the C-set generated above. There will now be eight 2s.

The next step 205 is to use the S2T1SP polarity indicator 321e (7 bits) to determine the polarity of the first seven 2s.

The next step 206 is to determine if an odd number of the first seven 2s are negative. If so, the last 2 is negative. Otherwise it is positive.

The last step 207, for the type 1 lattice point in shell 2 data point reconstruction case, is to recover the data point from the inflated lattice point by replacing each 2 with $2/\sqrt{8}$ and each $-2$ with $-2/\sqrt{8}$. A replacement value must have the same polarity as the value it is replacing. Replacement here is equivalent to multiplying each coordinate of the inflated lattice point by $1/\sqrt{8}$ in order to recover the data point. Replacement is much more efficient than multiplication.

RECEPTION OF A SHELL 2, TYPE 2, LATTICE POINT

Figure 10:
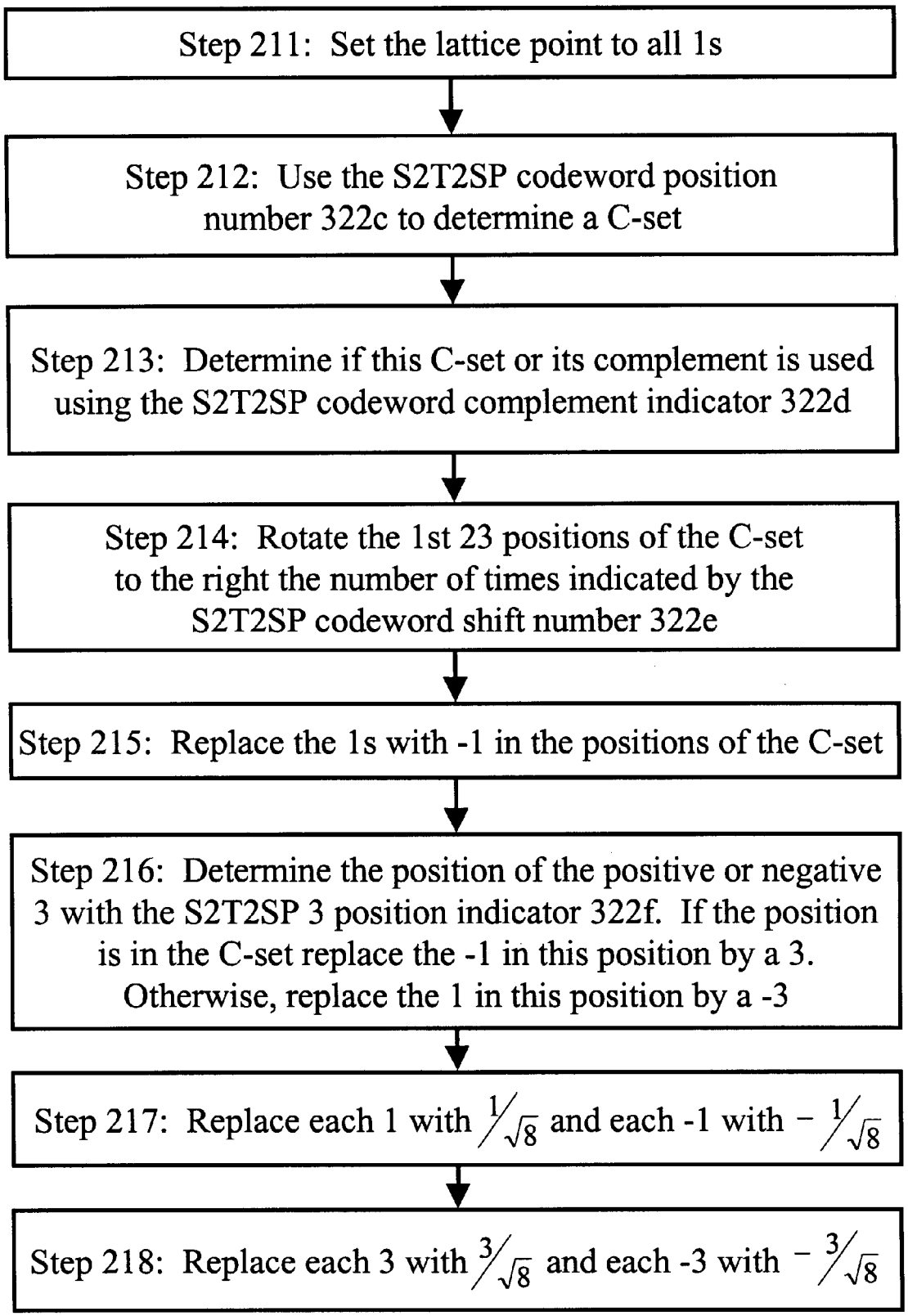
FIG. 10 is a list of steps for decoding a signal packet for a type 2 lattice point in shell 2 according to a method of the present invention.

FIG. 10 lists the steps, 211 through 218, that a receiver must perform in order to reconstruct a data point from a signal packet representing a type 2 lattice point in shell 2, an S2T2SP 322.

The first step 211 is to let the lattice point consist of all 1s.

The next step 212 is to use the S2T2SP codeword position number 322c (7 bits) as an index to the stored codeword table, taken from the extended Golay code, to determine a C-set. If the codeword position number 322c is 0, set the C-set to the empty set.

The next step 213 is to use the S2T2SP codeword complement indicator 322d (1 bit) to determine if we use this C-set or its complement.

The next step 214 is to rotate the first 23 positions of the C-set to the right the number of times determined by the S2T2SP codeword shift number 322e (5 bits) in order to form a new C-set.

The next step 215 is to replace the 1s by -1s in the positions of the C-set generated above.

The next step 216 is to use the S2T2SP 3s position indicator 322f (5 bits) to determine the position of the 3. If the position is in the C-set replace the -1 in this position by a 3. Otherwise, replace the 1 in this position by a -3.

The next step 217 is to replace each 1 by $1/\sqrt{8}$ and each -1 by $-1/\sqrt{8}$.

The last step 218 is to complete the recovery of the data point from the inflated lattice point by replacing each 3 with $3/\sqrt{8}$ and each -3 with $-3/\sqrt{8}$. A replacement value must have the same polarity as the value it is replacing.

RECEPTION OF A SHELL 2, TYPE 3, LATTICE POINT

Figure 11:
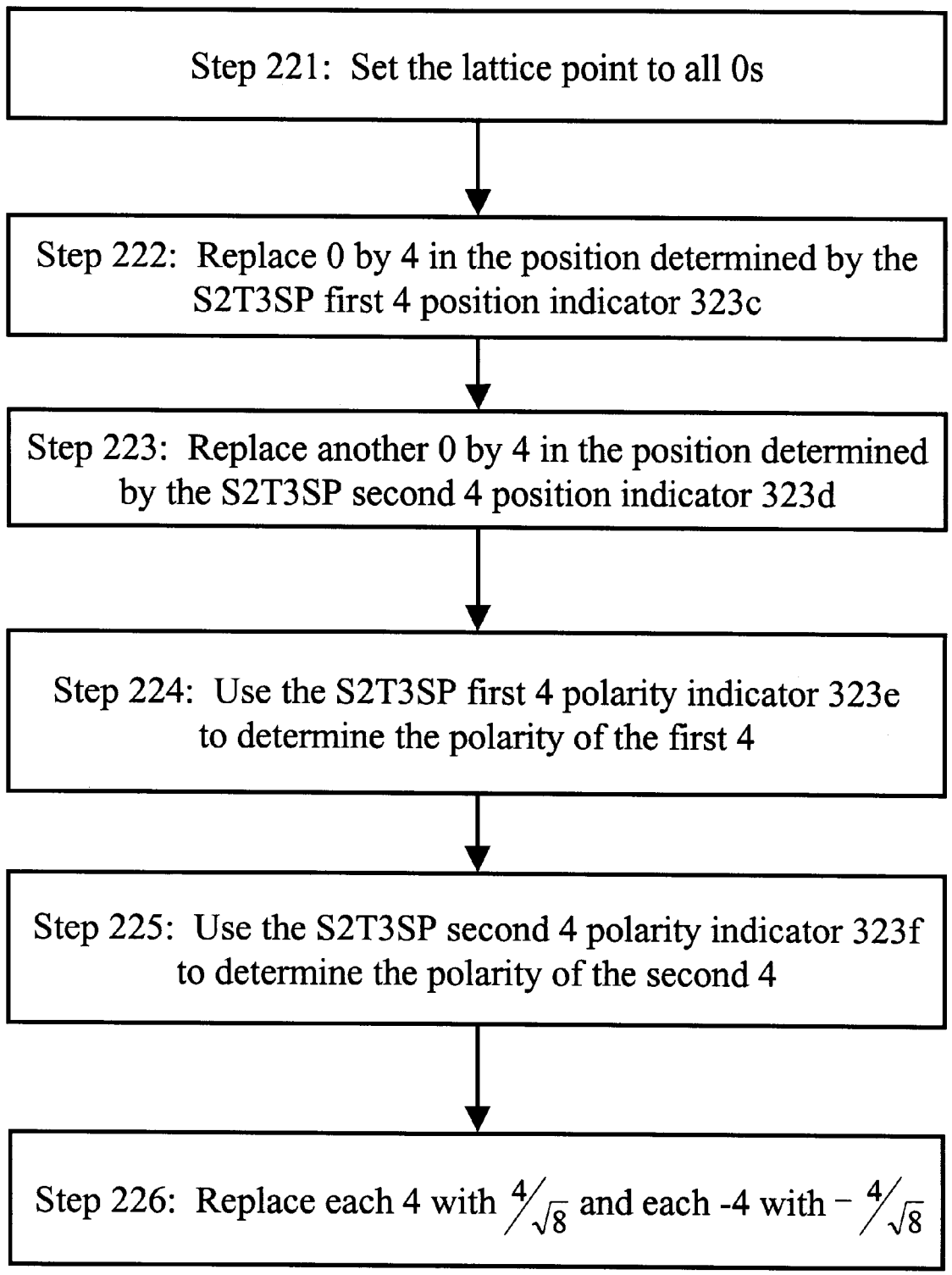
FIG. 11 is a list of steps for decoding a signal packet for a type 3 lattice point in shell 2 according to a method of the present invention.

FIG. 11 lists the steps, 221 through 226, that a receiver must perform in order to reconstruct a data point from a signal packet representing a type 3 lattice point in shell 2, an S2T3SP 323.

The first step 221 is to let the lattice point consist of all 0s.

The next step 222 is to replace 0 by 4 in the position determined by the S2T3SP first 4 position indicator 323c (5 bits).

The next step 223 to replace another 0 with a 4 in the position determined by the S2T3SP second 4 position indicator 323d (5 bits).

The next step 224 is to use the S2T3SP first 4 polarity indicator 323e (1 bit) to determine the polarity of the first 4.

The next step 225 is to use the S2T3SP second 4 polarity indicator 323f (1 bit) to determine the polarity of the second 4.

The last step 226 is to recover the data point from the inflated lattice point by replacing each 4 with $4/\sqrt{8}$ and each -4 with $-4/\sqrt{8}$. A replacement value must have the same polarity as the value it is replacing.

RECEPTION OF A SHELL 3, TYPE 1, LATTICE POINT

Figure 12:
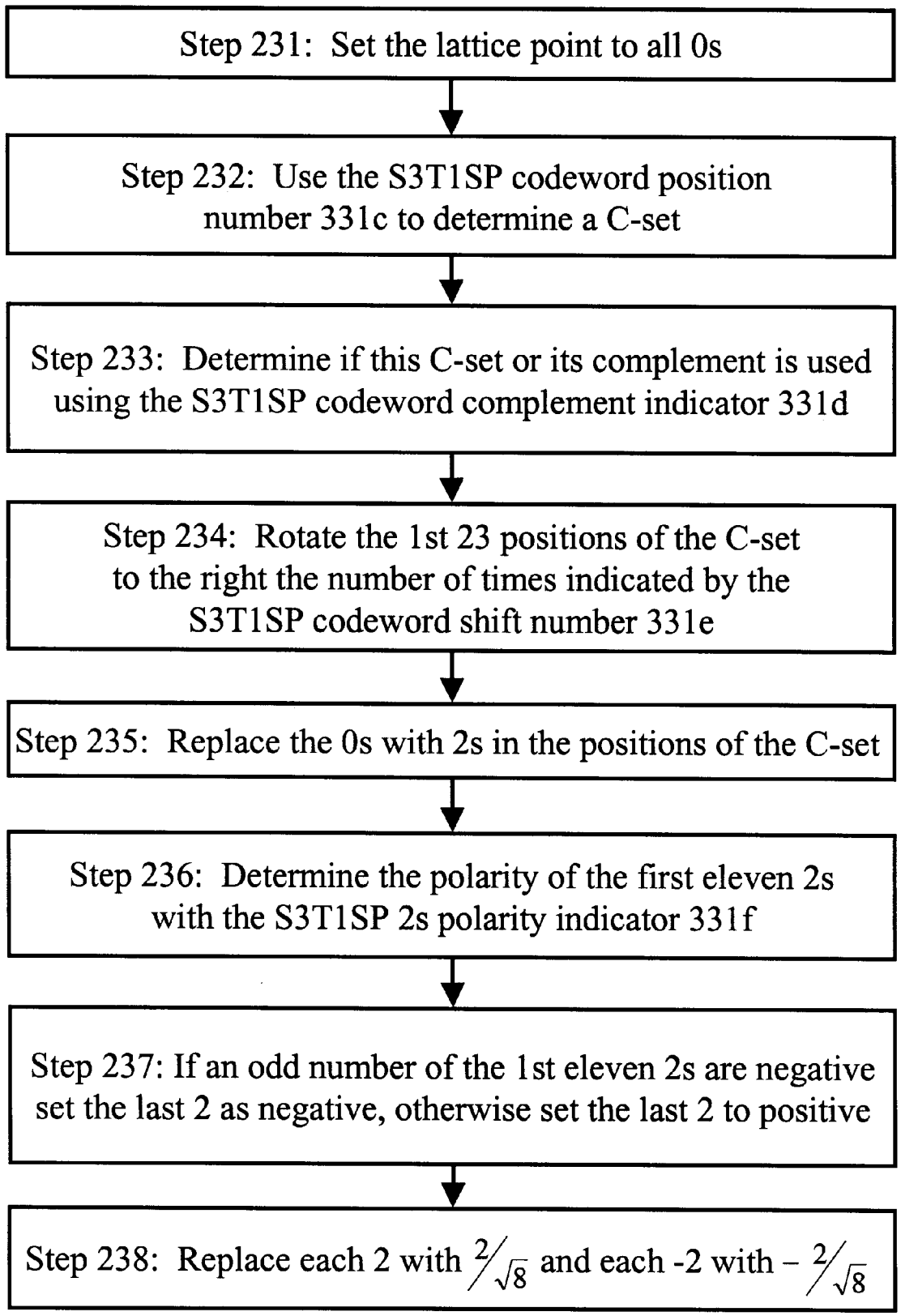
FIG. 12 is a list of steps for decoding a signal packet for a type 1 lattice point in shell 3 according to a method of the present invention.

FIG. 12 lists the steps, 231 through 238, that a receiver must perform in order to reconstruct a data point from a signal packet representing a type 1 lattice point in shell 3, an S3T1SP 331.

The first step 231 is to let the lattice point consist of all 0s.

The next step 232 is to use the S3T1SP codeword position number 331c (7 bits) as an index to the stored codeword table, taken from the extended Golay code, to determine a C-set.

The next step 233 is to use the S3T1SP codeword complement indicator 331d (1 bit) to determine if we use this C-set or its complement.

The next step 234 is to rotate the first 23 positions of the C-set to the right the number of times determined by the S3T1SP codeword shift number 331*e* (5 bits) in order to form a new C-set.

The next step 235 is to replace 0s by 2s in the positions of the C-set.

The next step 236 is to use the S3T1SP 2s polarity indicator 331*f* (11 bits) to determine the polarity of the first eleven 2s.

The next step 237 is to determine if an odd number of the first eleven 2s are negative. If so, the last 2 is negative. Otherwise it is positive.

The last step 238 is to recover the data point from the inflated lattice point by replacing each 2 with $2/\sqrt{8}$ and each −2 with $-2/\sqrt{8}$. A replacement value must have the same polarity as the value it is replacing.

RECEPTION OF A SHELL 3, TYPE 2, LATTICE POINT

Figure 13A:
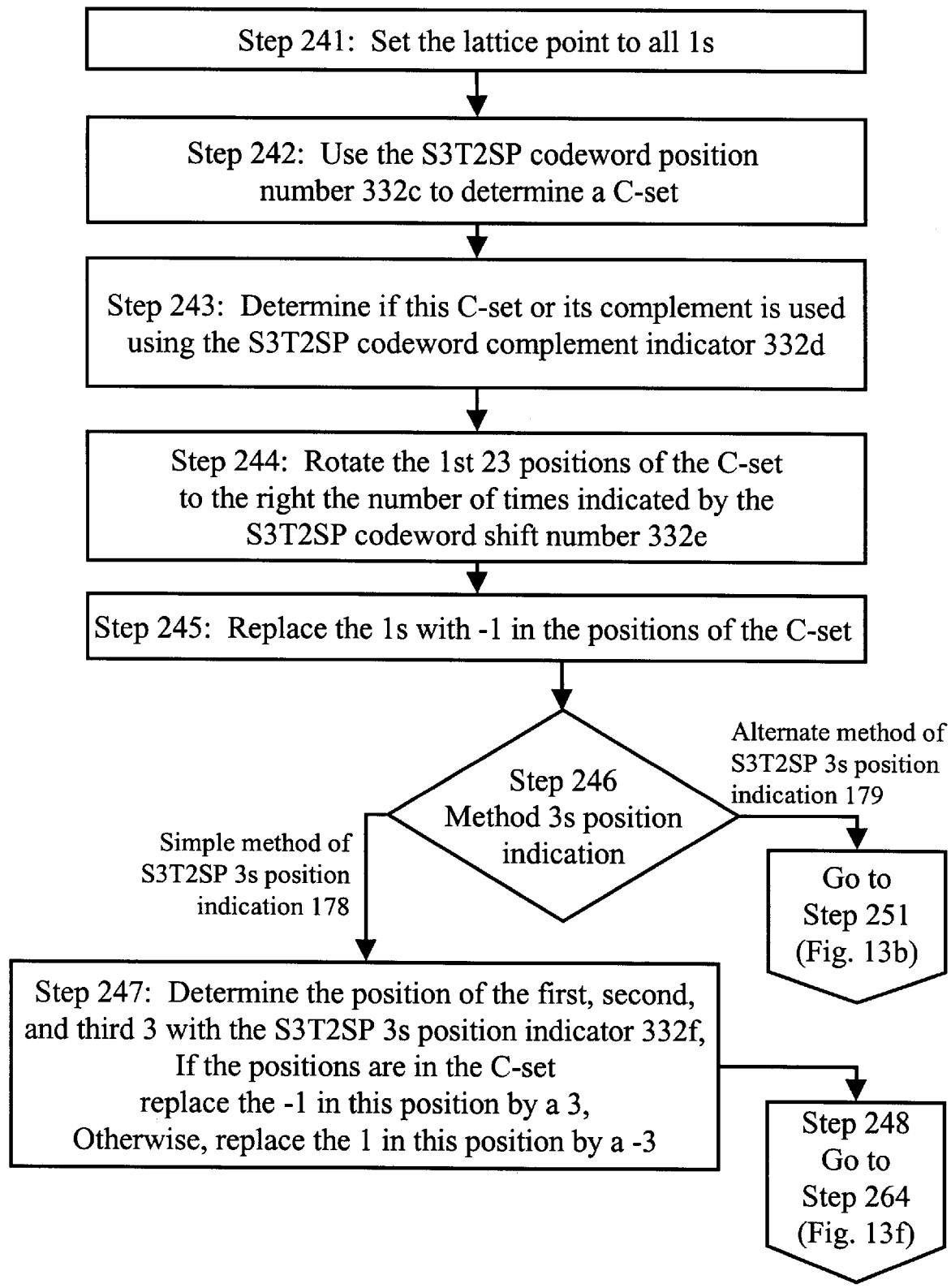
Figure 13B:
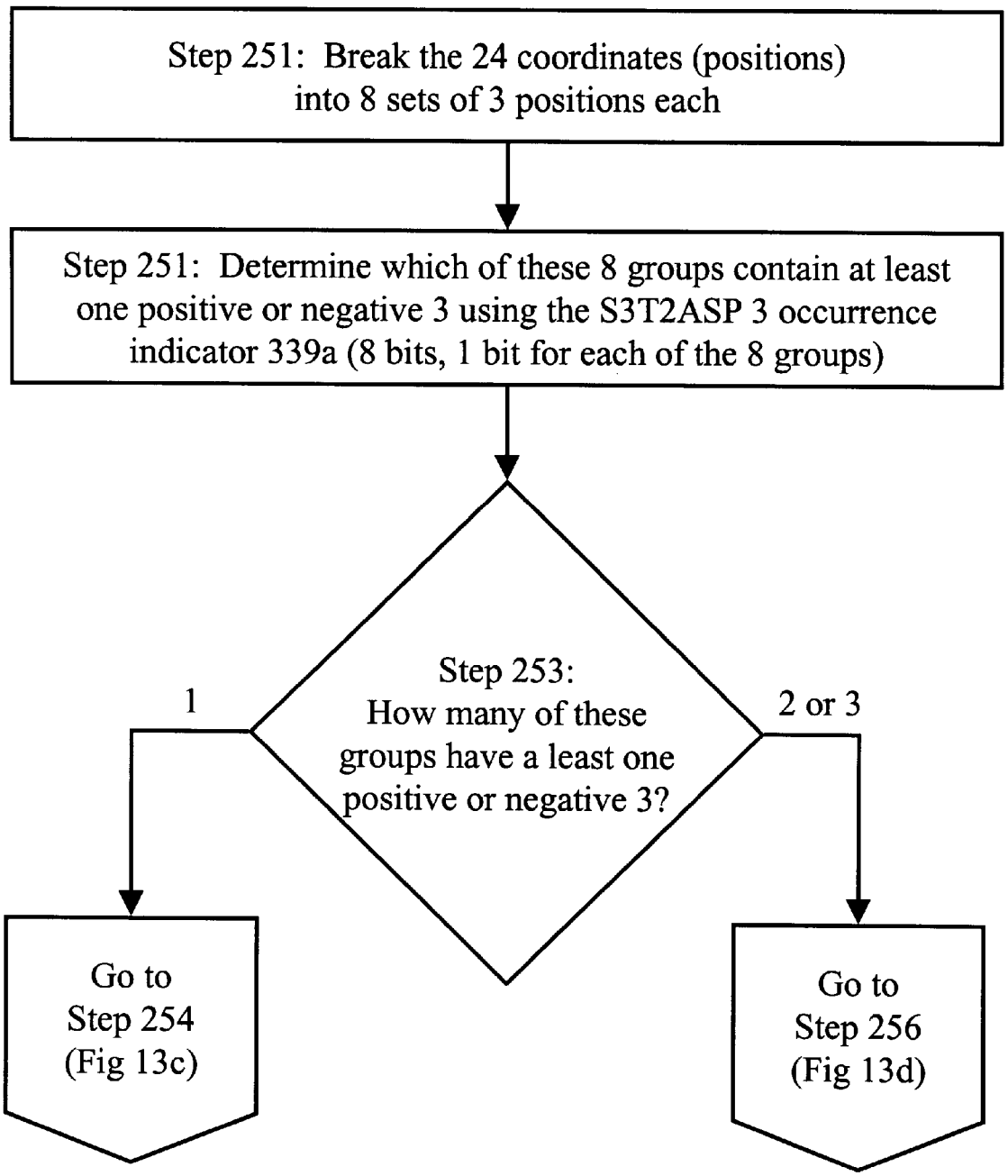
Figure 13D:
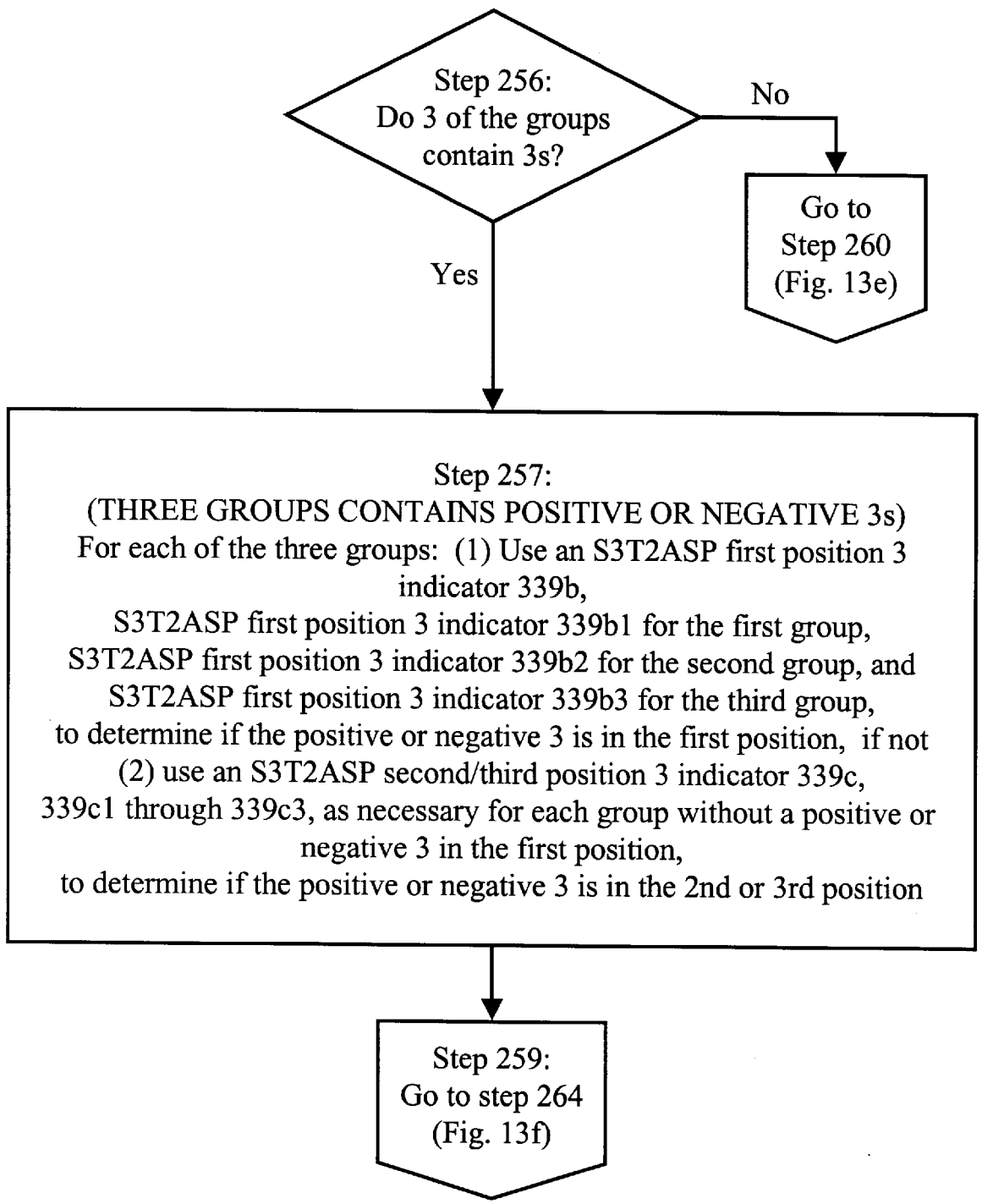

FIG. 13 lists the steps, 241 through 265 that a receiver must perform in order to reconstruct a data point from a signal packet representing a type 2 lattice point in shell 3, an S3T2SP 332, when using the simple method of S3T2SP 3s position indication 178, or an S3T2ASP 339, when using the alternate method of S3T2SP 3s position indication 179.

The first step 241 is to let the lattice point consist of all 1s.

The next step 242 is to use the S3T2SP codeword position number 332*c* (7 bits) as an index to the stored codeword table, taken from the extended Golay code, to determine a C-set. If the codeword position number 332*c* is 0, set the C-set to the empty set.

The next step 243 is to use the S3T2SP codeword complement indicator 332*d* (1 bit) to determine if we use this C-set or its complement.

The next step 244 is to rotate the first 23 positions of the C-set to the right the number of times determined by the S3T2SP codeword shift number 332*e* (5 bits) in order to form a new C-set.

The next step 245 is to replace 1s by −1s in the positions of the C-set.

The next step 246 is to go to step 251 if the alternate method of S3T2SP 3s position indication 179 is used and to continue to step 247 if the simple method of S3T2SP 3s position indication 178 is used. Nothing in the signal packets, S3T2SP 332 or S3T2ASP 339, indicates which method of 3s position indication is used (except for the total length of the packet). For this discussion the method used will have been chosen in advance and assumed to a priori knowledge to the receiver.

Alternatively, since when using the simple method of S3T2SP 3s position indication 178 for transmission of a shell 3 type 2 lattice point 31 bits are transmitted, and when using the alternate method of S3T2SP 3s position indication 179 thirty or fewer bits are transmitted, the receiver can determine which method of 3s position indication is used from the length of the signal packet, and hence the type of signal packet sent, S3T2SP 332 or S3T2ASP 339.

The next step 247 is to use the S3T2SP 3s position indicator 332*f* (15 bits) to determine the position of the first, second, and third 3. If these positions are in the C-set, replace the −1 in these positions by a 3. Otherwise replace the 1 in these positions by a −3.

The next step 248, when using the simple method of S3T2SP 3s position indication 178, as is used here, is to go to step 264.

The next step 251, when using the alternate method of S3T2SP 3s position indication 179, is to break the 24 coordinates (positions) into 8 groups of 3 positions each.

The next step 252 is to use the S3T2ASP 3 occurrence indicator 339*a* (8 bits, 1 bit for each of the 8 groups of 3 positions) to determine which of these groups contains at least one positive or negative 3.

The next step 253 is to go to step 254 if only one of these groups has a 3. Otherwise go to step 256.

EXACTLY ONE GROUP CONTAINS POSITIVE OR NEGATIVE 3s

The next step 254 is performed when exactly one of the groups has all three of the positive or negative 3s. For each position in this group we do the following: If this position is in the C-set, replace the −1 in this position by a 3. Otherwise replace the 1 in this position by a −3.

The next step 255 is to go to step 264.

The next step 256 is to check if three of the groups contain 3s. If so, go to step 257. Otherwise, go to step 260.

THREE GROUPS CONTAIN POSITIVE OR NEGATIVE 3s

The next step 257 is to do the following for each group with a positive or negative 3: (1) Use an S3T2ASP first position 3 indicator 339*b* (1 bit), S3T2ASP first position 3 indicator 339*b*1 for the first group with a positive or negative 3, S3T2ASP first position 3 indicator 339*b*2 for the second group with a positive or negative 3, and S3T2ASP first position 3 indicator 339*b*3 for the third group with a positive or negative 3, to determine if the positive or negative 3 is in the first position. If not, (2) use an S3T2ASP second/third position 3 indicator 339*c* (1 bit) to determine if it is in the second position or if it is in the third position. These S2T2ASP second/third position 3 indicators 339*c* are labeled 339*c*1 up to 339*c*3, as necessary for each group without a positive or negative 3 in the first position, as shown in FIG. 22*b*.

The next step 258 is to do the following for each position with a 3: If this position is in the C-set, replace the −1 in this position by a 3. Otherwise replace the 1 in this position by a −3.

The next step 259 is to go to step 264.

ONE GROUP HAS ONE AND ONE GROUP HAS TWO POSITIVE OR NEGATIVE 3s

The next step 260 is performed when one group has one 3 and one group has two 3s. Use the S3T2ASP group indicator 339*d* (1 bit) to determine if the first or the second of the two groups has the two 3s.

The next step 261 is to do the following for the group with one 3: Use the S3T2ASP one 3 group first position indicator 339*e* (1 bit) to determine if the positive or negative 3 is in the first position in the group with one positive or negative 3. If not, we use the S3T2ASP one 3 group second/third position indicator 339*f* (1 bit) to determine if it is in the second position or if it is in the third position.

The next step 262 is to do the following for the group with two 3s: Use the S3T2ASP two 3 group first position indicator 339*g* (1 bit) to determine if the 3 is in the first position. If so, we use the S3T2ASP two 3 group second/third position indicator 339*h* (1 bit) to determine if the other 3 is in the second position or if it is in the third position. If not, the two positive or negative 3s must be in the second and third positions.

The next step 263 is to do the following for each position with a positive or negative 3: If this position is in the C-set, replace the −1 in this position by a 3. Otherwise replace the 1 in this position by a −3.

The next step 264 is to replace each 1 by 1/√8 and each −1 by 1/√8.

The last step 265 is to complete the recovery of the data point from the inflated lattice point by replacing each 3 with 3/√8 and each −3 with −3/√8. A replacement value must have the same polarity as the value it is replacing.

RECEPTION OF A SHELL 3, TYPE 3, LATTICE POINT

Figure 14:
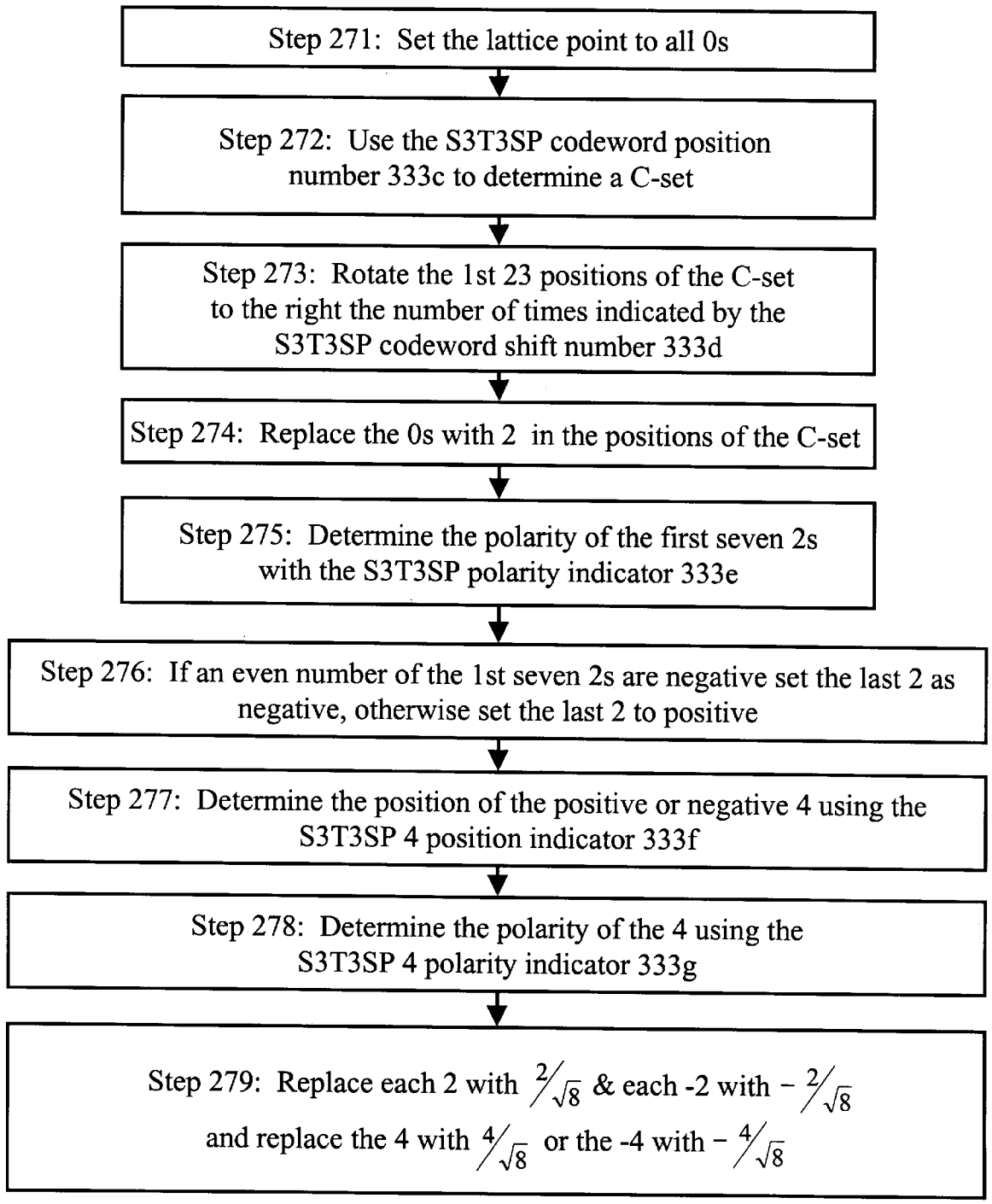
FIG. 14 is a list of steps for decoding a signal packet for a type 3 lattice point in shell 3 according to a method of the present invention.

FIG. 14 lists the steps, 271 through 279, that a receiver must perform in order to reconstruct a data point from a signal packet representing a type 3 lattice point in shell 3, an S3T3SP 333.

The first step 271 is to let the lattice point consist of all 0s.

The next step 272 is to use the S3T3SP codeword position number 333c (6 bits) as an index to the stored codeword table, taken from the extended Golay code, to determine a C-set.

The next step 273 is to rotate the first 23 positions of the C-set to the right the number of times determined by the S3T3SP codeword shift number 333d (5 bits) in order to form a new C-set.

The next step 274 is to replace the 0s by 2s in the positions of the C-set generated above. There will now be eight 2s.

The next step 275 is to use the S3T3SP polarity indicator 333e (7 bits) to determine the polarity of the first seven 2s.

The next step 276 is to determine if an even number of the first seven 2s are negative. If so, the last 2 is negative. Otherwise it is positive.

The next step 277 is to use the S3T3SP 4 position indicator 333f (4 bits) to determine the position of the positive or negative 4. Note that there are only 16 possible slots because only 0s can be replaced by a 4. Replace 0 by 4 in the position determined.

The next step 278 is to use the S3T3SP 4 polarity indicator 333g (1 bit) to determine the polarity of the 4.

The last step 279 is to recover the data point from the inflated lattice point by replacing each 2 with 2/√8, each −2 with −2/√8, and either the 4 by 4/√8 or the −4 by −4/√8. A replacement value must have the same polarity as the value it is replacing.

RECEPTION OF A SHELL 3, TYPE 4, LATTICE POINT

Figure 15:
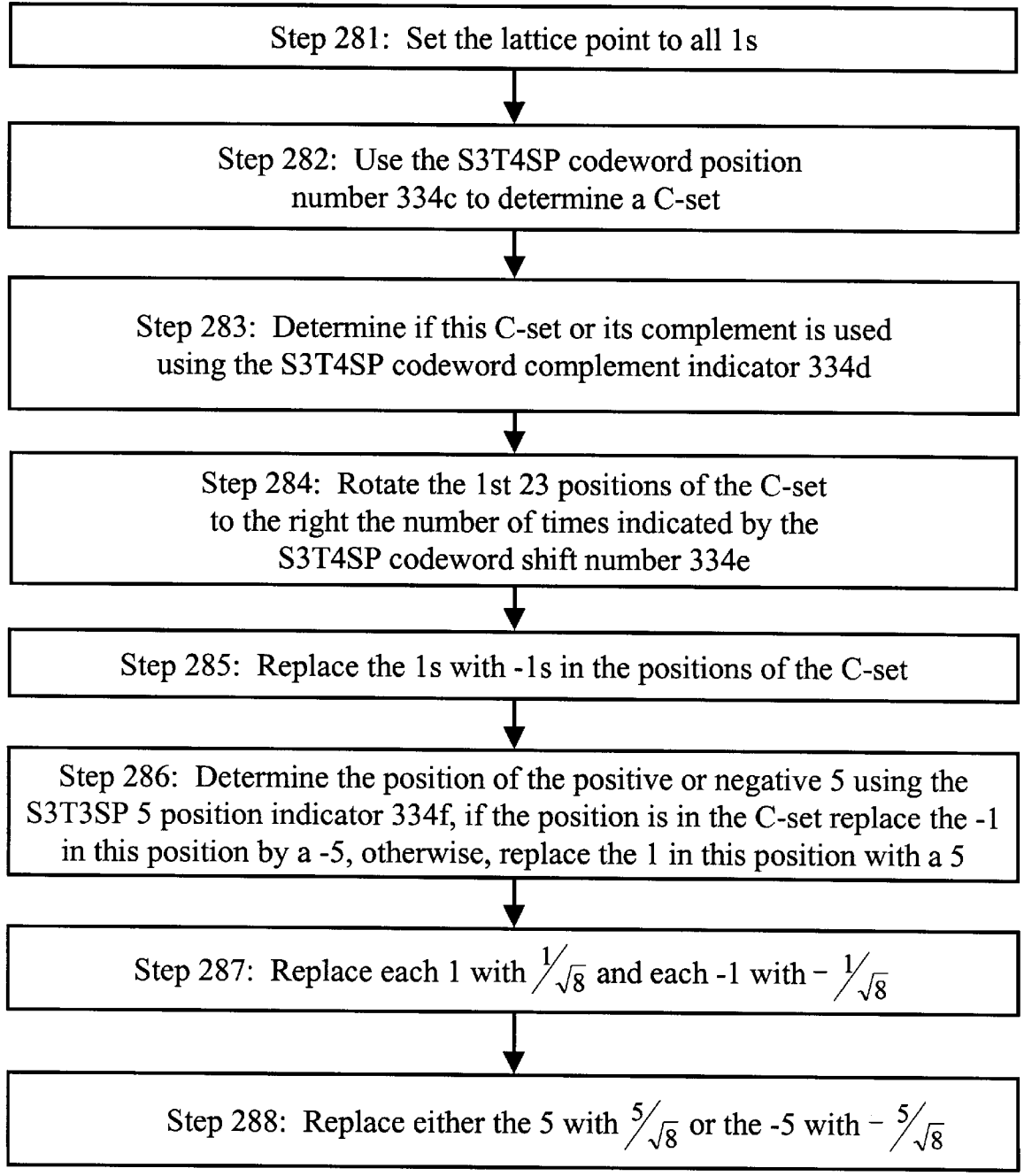
FIG. 15 is a list of steps for decoding a signal packet for a type 4 lattice point in shell 3 according to a method of the present invention.

FIG. 15 lists the steps, 281 through 288, that a receiver must perform in order to reconstruct a data point from a signal packet representing a type 4 lattice point in shell 3, an S3T4SP 334.

The first step 281 is to let the lattice point consist of all 1s.

The next step 282 is to use the S3T4SP codeword position number 334c (7 bits) as an index to the stored codeword table, taken from the extended Golay code, to determine a C-set. If the codeword position number 334c is 0, set the C-set to the empty set.

The next step 283 is to use the S3T4SP codeword compliment indicator 334d (1 bit) to determine if we use this C-set or its complement.

The next step 284 is to rotate the first 23 positions of the C-set to the right the number of times determined by the S3T4SP codeword shift number 334e (5 bits) in order to form a new C-set.

The next step 285 is to replace the 1s by −1s in the positions of the C-set generated above.

The next step 286 is to use the S3T4SP 5 position indicator 334f (5 bits) to determine the position of the positive or negative 5. If the position is in the C-set replace the −1 in this position by a −5. Otherwise, replace the 1 in this position by a 5.

The next step 287 is to replace each 1 by 1/√8 and each −1 by −1/√8.

The last step 288 is to complete the recovery of the data point from the inflated lattice point by replacing either the 5 with 5/√8 or the −5 with −5/√8. A replacement value must have the same polarity as the value it is replacing.

Although various preferred embodiments and methods of the present invention have been described herein in detail to provide for complete and clear disclosure, it will be appreciated by those skilled in the art, that variations may be made thereto without departing from the spirit of the invention or the scope of the appended claims.

What is claimed is:

1. A method of lattice-quantizing and communicating 24 dimensional data points in a manner that minimizes storage requirements, comprising the steps of:

a) creating an indexed list of 89 codewords, of 24 bits each, from the extended Golay code, from which all codewords of the extended Golay code can be produced through the circular rotation of the first 23 bits of each of said 89 codewords and the logical complementing of each of said possible circular rotations of each of said 89 codewords, and indexing them by codeword position numbers from 1 to 89;

b) forming an inflated Leech lattice by multiplying each lattice point of a Leech lattice by the square-root of 8;

c) acquiring 24-dimensional data points in sequence; and d) for each of said 24-dimensional data points acquired in sequence, lattice-quantizing each of said 24-dimensional data points to create a signal packet and transmitting said signal packet to a receiver, further comprising the steps of:

i) multiplying each coordinate of said 24-dimensional data point acquired in sequence by the square root of 8 to form an inflated data point;

ii) finding the closest lattice point to said inflated data point on said inflated Leech lattice;

iii) determining the shell number and type number of said closest lattice point on said inflated Leech lattice;

iv) for said closest lattice points in shell 2 and of type 3, assembling a signal packet for a lattice point of type 3 in shell 2, having 1 bit to indicate the point is in shell 2, 2 bits to indicate the point is of type 3, 5 bits to indicate the position of the first positive or negative 4, 5 bits to indicate the position of the second positive or negative 4, 1 bit to indicate the polarity of the first 4, and having 1 bit to indicate the polarity of the second 4;

v) for said closest lattice points not in shell 2 and of type 3, determining the parameters for a signal packet, further comprising the steps of:

determining the C-set of said closest lattice point;
forming a closest lattice point extended Golay codeword from said C-set by substituting 1s in the positions of said C-set and 0s elsewhere;
logically complementing said closest lattice point extended Golay codeword if its weight is greater than 12 or if its weight is equal to 12 and it has a final bit of 1;

circularly shifting the first 23 bits of said closest lattice point extended Golay codeword until said closest lattice point extended Golay codeword is the smallest binary number closest lattice point extended Golay codeword achievable through such circular shifting;

for said smallest binary number closest lattice point extended Golay codeword that is not all-zeros, finding said closest lattice point extended Golay codeword in said indexed list of 89 codewords and recording the indexed codeword position number; and for said smallest binary number closest lattice point extended Golay codeword that is all-zeros, setting the codeword position number to 0;

vi) for said closest lattice points not in shell 2 and of type 3, constructing a signal packet identifying the shell and type of said closest lattice point, smallest binary number closest lattice point extended Golay codeword, whether said smallest binary number closest lattice point extended Golay codeword was logically complemented, and the position and polarity of the positions of said C-set; and vii) transmitting said signal packet to a receiver.

2. The method of claim 1, wherein the step of constructing a signal packet further comprises the steps of:

a) for said closest lattice point of type 1 in shell 2, constructing a signal packet having 1 bit to indicate the point is in shell 2, 2 bits to indicate the point is of type 1, 6 bits to indicate the codeword position number, 5 bits to indicate the number of shifts, and having 7 bits to indicate the polarity of the first seven 2s;

b) for said closest lattice point of type 2 in shell 2, constructing a signal packet having 1 bit to indicate the point is in shell 2, 2 bits to indicate the point is of type 2, 7 bits to indicate the codeword position number, 1 bit to indicate if said closest lattice point extended Golay codeword was complemented, 5 bits to indicate the number of shifts, and having 5 bits to indicate the position of the positive or negative 3;

c) for said closest lattice point of type 1 in shell 3, constructing a signal packet having 1 bit to indicate the point is in shell 3, 2 bits to indicate the point is of type 1, 7 bits to indicate the codeword position number, 1 bit to indicate if said closest lattice point extended Golay codeword was complemented, 5 bits to indicate the number of shifts, and having 11 bits to indicate the polarity of the first eleven 2s;

d) for said closest lattice point of type 2 in shell 3, constructing a signal packet having 1 bit to indicate the point is in shell 3, 2 bits to indicate the point is of type 2, 7 bits to indicate the codeword position number, 1 bit to indicate if said closest lattice point extended Golay codeword was complemented, 5 bits to indicate the number of shifts, and having a 3s position indicator to indicate the position of the positive or negative 3s;

e) for said closest lattice point of type 3 in shell 3, constructing a signal packet having 1 bit to indicate the point is in shell 3, 2 bits to indicate the point is of type 3, 6 bits to indicate the codeword position number, 5 bits to indicate the number of shifts, 7 bits to indicate the polarity of the first seven 2s, 4 bits to indicate the position of the positive or negative 4, and having one bit for the polarity of the 4; and f) for said closest lattice point of type 3 in shell 4, constructing a signal packet having 1 bit to indicate the point is in shell 3, 2 bits to indicate the point is of type 4, 7 bits to indicate the codeword position number, 1 bit to indicate if said closest lattice point extended Golay codeword was complemented, 5 bits to indicate the number of shifts, and having 5 bits to indicate the position of the positive or negative 5.

3. The method of claim 2, further comprising the steps of:

a) having said receiver receive said transmitted signal packet;

b) determining the shell number and type number of said closest lattice point from said signal packet;

c) for said closest lattice point in shell 2 and of type 1:
retrieving one of said 89 codewords according to the indexed codeword position number;
setting said closest lattice point to all 0s;
creating a retrieved C-set from said one of 89 codewords retrieved;
circularly rotating the first 23 positions of said retrieved C-set the number of positions indicated by said codeword shift number;
replacing the 0s with 2s in position in the retrieved C-set;
setting the polarity of the first seven 2s as indicated in said signal packet; and
setting the polarity of the last 2 based on the polarity of the first seven 2s;

d) for said closest lattice point in shell 2 and of type 2:
retrieving one of said 89 codewords according to the indexed codeword position number if the indexed codeword position number is from 1 to 89;
setting said closest lattice point to all 1s;
creating a retrieved C-set from said one of 89 codewords retrieved or creating the retrieved C-set as the empty set if the indexed codeword position number is 0;
complementing said retrieved C-set if indicated by said signal packet;
circularly rotating the first 23 positions of said retrieved C-set the number of positions indicated by said codeword shift number;
replacing the 1s with −1s in position in the retrieved C-set; and
determining the position of the positive or negative 3 from the signal packet and replacing the −1 in this position in the C-set with a 3 or the 1 in this position not in the C-set with a −3;

e) for said closest lattice point in shell 2 and of type 3:
setting said closest lattice point to all 0s;
replacing the 0 by 4 in the position of said closest lattice point indicated by said signal packet;
replacing another 0 by 4 in the position of said closest lattice point as indicted by said signal packet;
setting the polarity of the first 4 in said closest lattice point as indicated by said signal packet; and
setting the polarity of the second 4 in said closest lattice point as indicated by said signal packet;

f) for said closest lattice point in shell 3 and of type 1:
retrieving one of said 89 codewords according to the indexed codeword position number;
setting said closest lattice point to all 0s;
creating a retrieved C-set from said one of 89 codewords retrieved;
complementing said retrieved C-set if indicated by said signal packet;
circularly rotating the first 23 positions of said retrieved C-set the number of positions indicated by said codeword shift number;

replacing the 0s with 2s in position in the retrieved C-set;
setting the polarity of the first eleven 2s as indicated in said signal packet; and
setting the polarity of the last 2 based on the polarity of the first eleven 2s;

g) for said closest lattice point in shell 3 and of type 2:
retrieving one of said 89 codewords according to the indexed codeword position number if the indexed codeword position number is from 1 to 89;
setting said closest lattice point to all 1s;
creating a retrieved C-set from said one of 89 codewords retrieved or creating the retrieved C-set as the empty set if the indexed codeword position number is 0;
complementing said retrieved C-set if indicated by said signal packet;
circularly rotating the first 23 positions of said retrieved C-set the number of positions indicated by said codeword shift number;
replacing the 1s with −1s in position in the retrieved C-set;
determining the positions of the positive or negative 3s from the signal packet and replacing the −1 in this position in the C-set with a 3 or the 1 in this position not in the C-set with a −3;

h) for said closest lattice point in shell 3 and of type 3:
retrieving one of said 89 codewords according to the indexed codeword position number;
setting said closest lattice point to all 0s;
creating a retrieved C-set from said one of 89 codewords retrieved;
circularly rotating the first 23 positions of said retrieved C-set the number of positions indicated by said codeword shift number;
replacing the 0s with 2s in position in the retrieved C-set;
setting the polarity of the first seven 2s as indicated in said signal packet; and
setting the polarity of the last 2 based on the polarity of the first seven 2s;
replacing the position in said closest lattice point indicated in said signal packet with a 4; and
setting the polarity of said 4 as indicated by said signal packet;

i) for said closest lattice point in shell 3 and of type 4:
retrieving one of said 89 codewords according to the indexed codeword position number if the indexed codeword position number is from 1 to 89;
setting said closest lattice point to all 1s;
creating a retrieved C-set from said one of 89 codewords retrieved or creating the retrieved C-set as the empty set if the indexed codeword position number is 0;
complementing said retrieved C-set if indicated by said signal packet;
circularly rotating the first 23 positions of said retrieved C-set the number of positions indicated by said codeword shift number;
replacing the 1s with −1s in position in the retrieved C-set; and
determining the positions of the positive or negative 5 from the signal packet and replacing the −1 in this position in the C-set with a −5 or the 1 in this position not in the C-set with a 5;

j) replacing each positive and negative 1 in said closest lattice point by the reciprocal of the square root of 8 of the same polarity;

k) replacing each positive and negative 2 in said closest lattice point by 2 divided by the square root of 8 of the same polarity;

l) replacing each positive and negative 3 in said closest lattice point by 3 divided by the square root of 8 of the same polarity;

m) replacing each positive and negative 4 in said closest lattice point by 4 divided by the square root of 8 of the same polarity; and n) replacing each positive and negative 5 in said closest lattice point by 5 divided by the square root of 8 of the same polarity.

4. The method of claim 3, wherein said receiver comprises means for determining the composition of said 3s position indicator in said signal packet for said closest lattice point of type 2 in shell 3 from the length of said signal packet for said closest lattice point of type 2 in shell 3.

5. The method of claim 2, wherein said 3s position indicator is comprised of 15 bits to indicate the position of the positive and negative 3s.

6. The method of claim 2, wherein said 3s position indicator is comprised of:
1 bit for each of 8 groups of 3 positions, into which the 24 possible positions of said lattice point have been divided, to indicate if said group of 3 positions contains any positive or negative 3s;
1 bit for each of said groups of 3 positions, containing a positive or negative 3, to indicate if a positive or negative 3 is contained in the first position of said group of 3 positions when exactly three of said groups of 3 positions contain a positive or negative 3;
1 bit for each of said groups of 3 positions, containing a positive or negative 3, and not containing a positive or negative 3 in the first position, to indicate if a positive or negative 3 is contained in the second position or in the third position of said group of 3 positions when exactly three of said groups of 3 positions contain a positive or negative 3;
1 bit to indicate if the first or second two of said groups of 3 positions contains two positive or negative 3s when exactly two of said groups of 3 positions contain positive or negative 3s;
1 bit to indicate if said group of 3 positions, containing one positive or negative 3, when exactly two of said groups of 3 positions contain positive or negative 3s, contains the positive or negative 3 in the first position;
1 bit to indicate if said group of 3 positions, containing one positive or negative 3, and not containing a positive or negative 3 in the first position, when exactly two of said groups of 3 positions contain positive or negative 3s, contains the positive or negative 3 in the second position or in the third position;
1 bit to indicate if said group of 3 positions, containing two positive or negative 3s, when exactly two of said groups of 3 positions contain positive or negative 3s, contains a positive or negative 3 in the first position; and
1 bit to indicate if said group of 3 positions, containing two positive or negative 3s with one positive or negative 3 in the first position, when exactly two of said groups of 3 positions contain positive or negative 3s, contains the second positive or negative 3 in the second position or contains the positive or negative 3 in the third position.

7. The method of claim 1, further comprising the steps of:

a) having said receiver receive said transmitted signal packet;

b) recovering said closest lattice point according to said signal packet;

c) replacing each positive and negative 1 in said closest lattice point by the reciprocal of the square root of 8 of the same polarity;

d) replacing each positive and negative 2 in said closest lattice point by 2 divided by the square root of 8 of the same polarity;

e) replacing each positive and negative 3 in said closest lattice point by 3 divided by the square root of 8 of the same polarity;

f) replacing each positive and negative 4 in said closest lattice point by 4 divided by the square root of 8 of the same polarity; and g) replacing each positive and negative 5 in said closest lattice point by 5 divided by the square root of 8 of the same polarity.

8. The method of claim 7, wherein said receiver comprises means for determining the composition of said 3s position indicator in said signal packet for said closest lattice point of type 2 in shell 3 from the length of said signal packet for said closest lattice point of type 2 in shell 3.

9. The method of claim 1, wherein said step of creating an indexed list of 89 codewords, of 24 bits each, from the extended Golay code from which all codewords of the extended Golay code can be produced through the circular rotation of the first 23 bits of each of said 89 codewords and the logical complementing of each of said possible circular rotations of each of said 89 codewords is further comprised of the steps of:

a) starting with all the codewords of the extended Golay code;

b) selecting all of the octads of said codewords of the extended Golay code;

c) dividing said octads into 33 octad groups of 23 members each, such that all of the members of each of said octad groups may be obtained from any other member by circularly rotating the first 23 bits of that other member of said octad group;

d) selecting the member which represents the smallest binary number from each of said octad groups;

e) selecting all of the dodecads of said codewords of the extended Golay code having a 0 as the last bit;

f) dividing said dodecads of said codewords of the extended Golay code having a 0 as the last bit into 56 dodecad groups of 23 members each, such that all of the members of each of said dodecad groups may be obtained from any other member by circularly rotating the first 23 bits of that other member of said dodecad group;

g) selecting the member which represents the smallest binary number from each of said dodecad groups;

h) combining the members which represent the smallest binary number from each of said octad groups with the member which represent the smallest binary number from each of said dodecad group 89 codewords; and i) indexing the list of 89 codewords into codeword positioners of 1 to 89.

* * * * *